(12) United States Patent
Gardiner et al.

(10) Patent No.: US 10,014,154 B2
(45) Date of Patent: Jul. 3, 2018

(54) METHOD FOR ENABLING MODULAR PART REPLACEMENT WITHIN AN ELECTRON MICROSCOPE SAMPLE HOLDER

(71) Applicant: PROTOCHIPS, INC., Morrisville, NC (US)

(72) Inventors: Daniel Stephen Gardiner, Wake Forest, NC (US); Franklin Stampley Walden, II, Raleigh, NC (US); John Damiano, Jr., Apex, NC (US)

(73) Assignee: Protochips, Inc., Morrisville, NC (US)

( * ) Notice: Subject to any disclaimer, the term of this patent is extended or adjusted under 35 U.S.C. 154(b) by 0 days.

(21) Appl. No.: 15/154,157

(22) Filed: May 13, 2016

(65) Prior Publication Data

US 2016/0336144 A1   Nov. 17, 2016

Related U.S. Application Data

(60) Provisional application No. 62/160,851, filed on May 13, 2015.

(51) Int. Cl.
*H01J 37/00* (2006.01)
*H01J 37/20* (2006.01)
*H01J 37/26* (2006.01)

(52) U.S. Cl.
CPC .............. *H01J 37/20* (2013.01); *H01J 37/26* (2013.01); *H01J 2237/2003* (2013.01); *H01J 2237/204* (2013.01)

(58) Field of Classification Search
CPC .... H01J 37/20; H01J 37/26; H01J 2237/2003; H01J 2237/204

USPC ................................. 250/306, 307, 310, 311
See application file for complete search history.

(56) References Cited

U.S. PATENT DOCUMENTS

| | | | |
|---|---|---|---|
| 8,466,432 B2 | 6/2013 | Damiano, Jr. et al. |
| 8,513,621 B2 | 8/2013 | Nackashi et al. |
| 8,853,646 B2 | 10/2014 | Nackashi et al. |
| 8,859,991 B2 | 10/2014 | Nackashi et al. |
| 8,872,128 B2 | 10/2014 | Damiano, Jr. et al. |
| 8,872,129 B2 | 10/2014 | Damiano, Jr. et al. |
| 9,048,065 B2 | 6/2015 | Damiano et al. |
| 9,275,825 B2 | 3/2016 | Damiano et al. |
| 9,275,826 B2 | 3/2016 | Damian, Jr. et al. |
| 9,312,097 B2 | 4/2016 | Nackashi et al. |
| 9,437,393 B2 | 9/2016 | Damian, Jr. et al. |

(Continued)

FOREIGN PATENT DOCUMENTS

JP    2014026840 A    2/2014

OTHER PUBLICATIONS

ISA/KR, International Search Report and Written Opinion of PCT Patent Application No. PCT/US2016/032354, dated Aug. 26, 2016.

(Continued)

*Primary Examiner* — Nicole Ippolito
*Assistant Examiner* — Hanway Chang
(74) *Attorney, Agent, or Firm* — NK Patent Law, PLLC

(57) ABSTRACT

An electron microscope sample holder that includes at least one capillary having a sufficient inner diameter to act as a catheter pathway that allows objects that can be accommodated within the at least one capillary to be replaced or swapped with other objects. The sample holder having at least one capillary allows the user to insert and remove temporary fluidic pathways, sensors or other tools without the need to dissemble the holder.

20 Claims, 26 Drawing Sheets

(56) References Cited

U.S. PATENT DOCUMENTS

| | | |
|---|---|---|
| 9,466,459 B2 | 10/2016 | Gardiner et al. |
| 2012/0025103 A1* | 2/2012 | Deshmukh ......... G01N 21/0303 |
| | | 250/491.1 |
| 2012/0138792 A1 | 6/2012 | Danilov et al. |
| 2013/0040400 A1 | 2/2013 | Konings et al. |
| 2013/0264476 A1 | 10/2013 | Damiano, Jr. et al. |
| 2014/0295053 A1 | 10/2014 | Felts et al. |
| 2015/0235805 A1* | 8/2015 | Gardiner ............... H01J 37/261 |
| | | 436/163 |

OTHER PUBLICATIONS

WIPO, International Preliminary Report on Patentability of PCT Patent Application No. PCT/US2016/032354, dated Nov. 14, 2017.

* cited by examiner

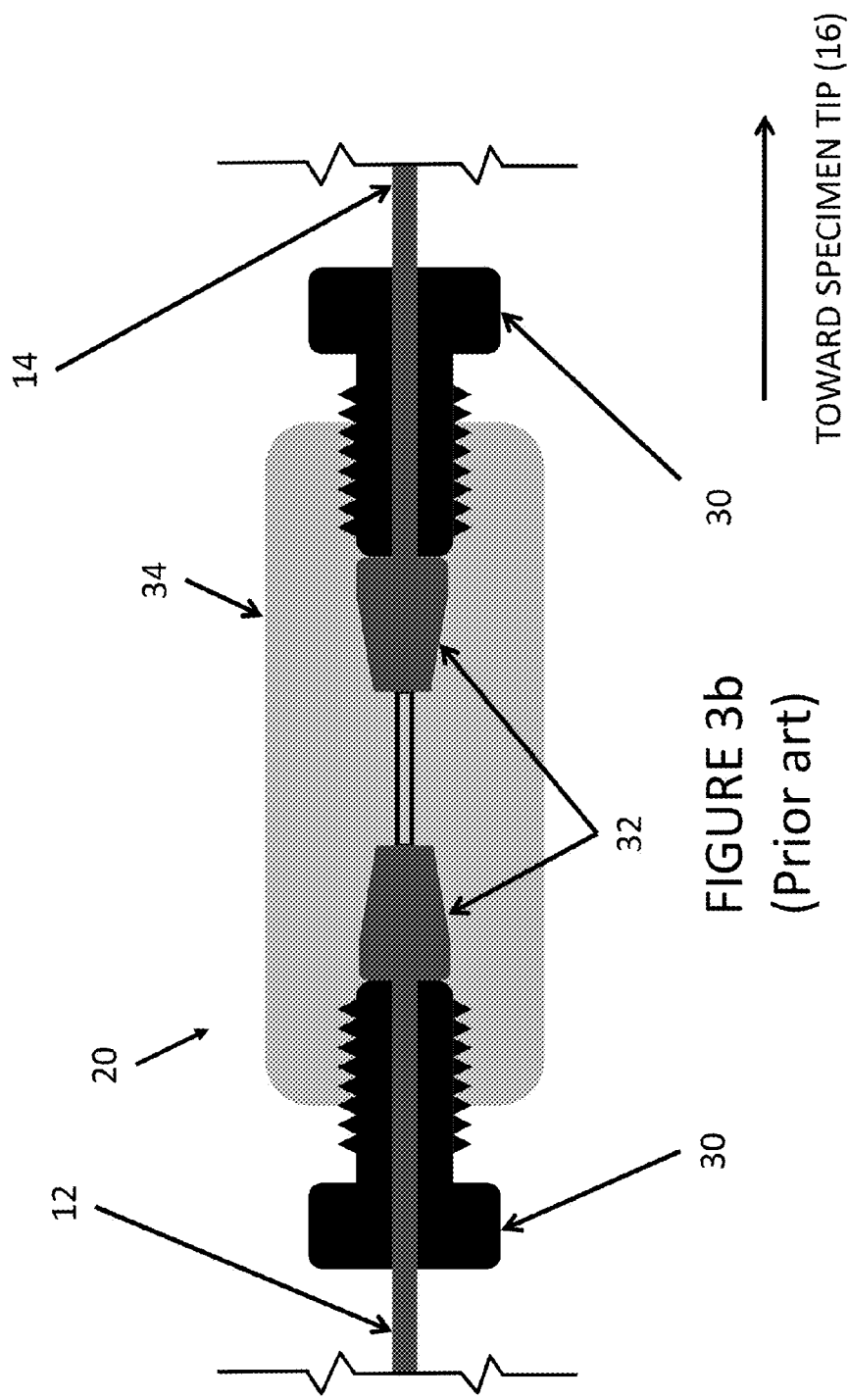

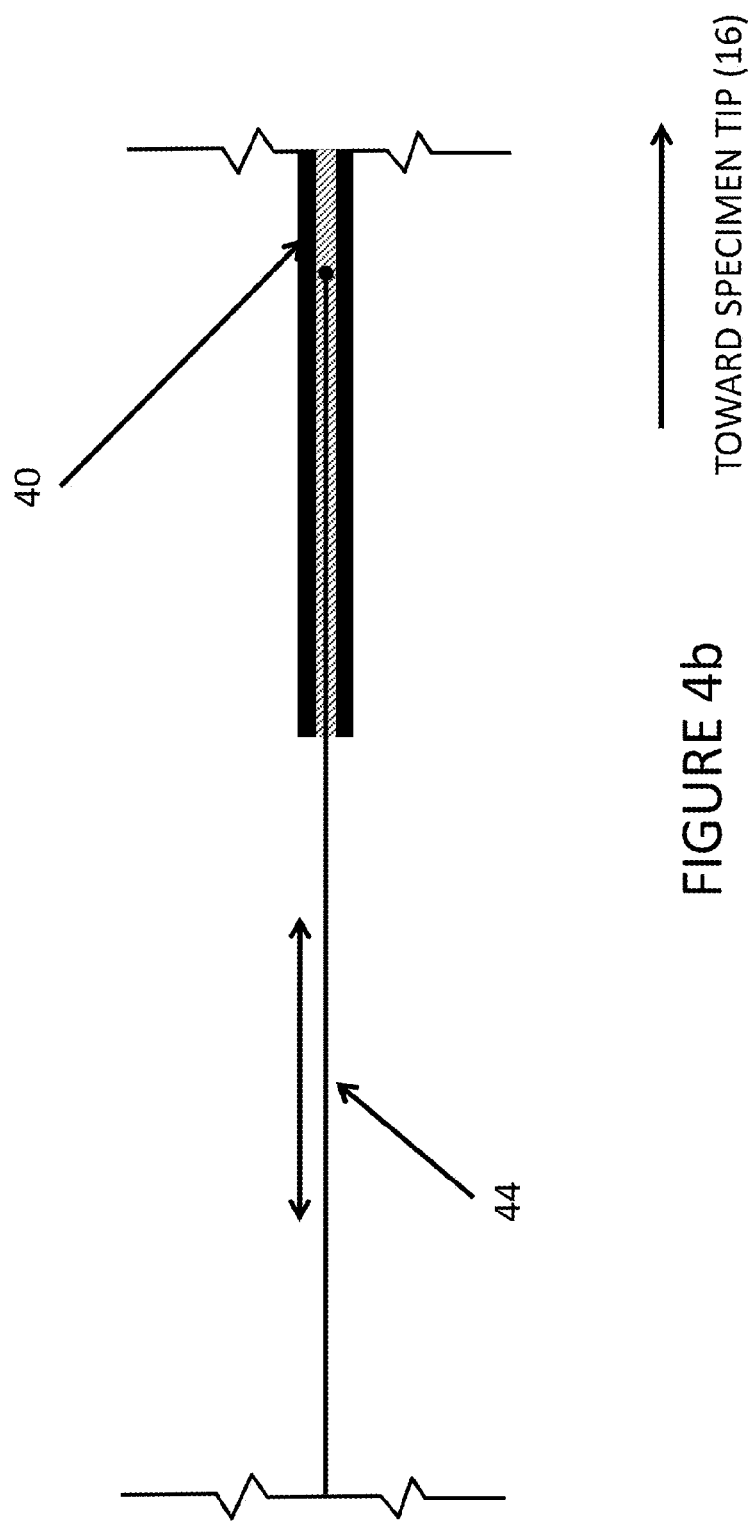

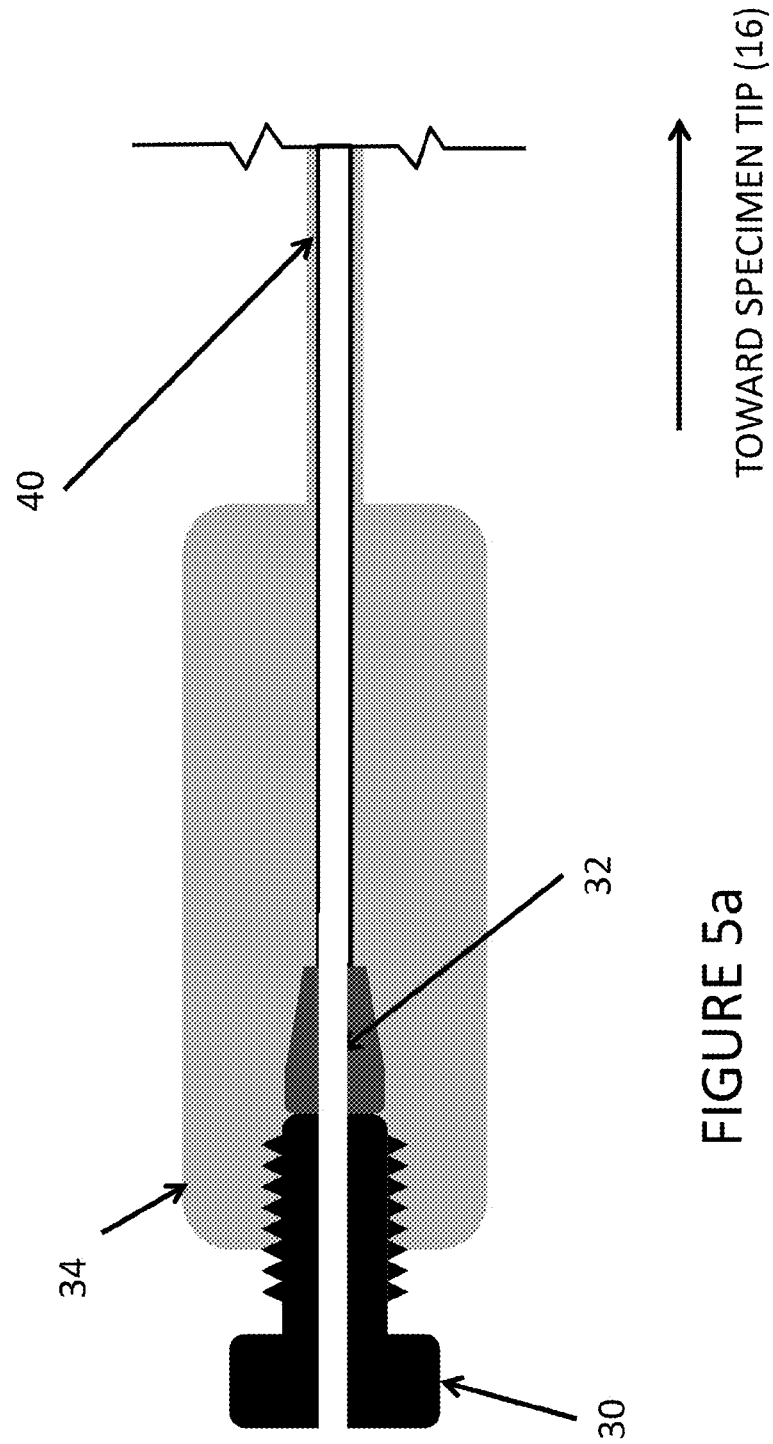

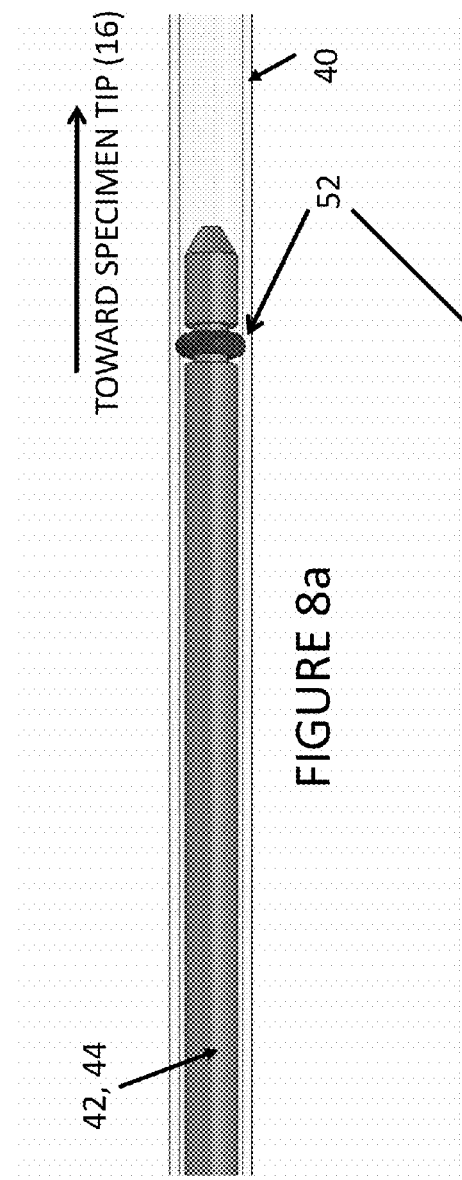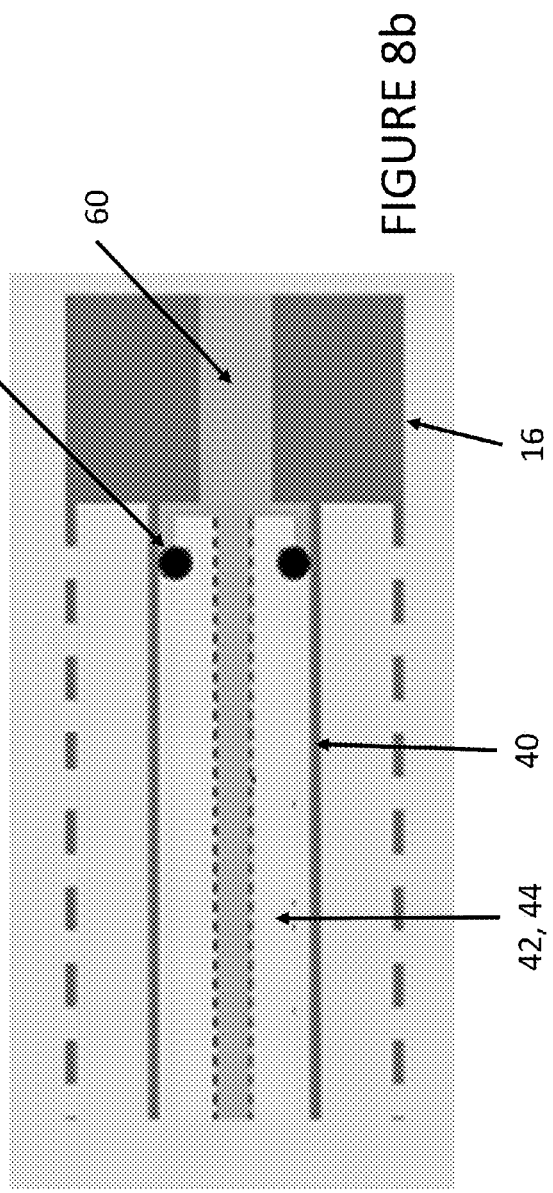
FIGURE 8a
FIGURE 8b

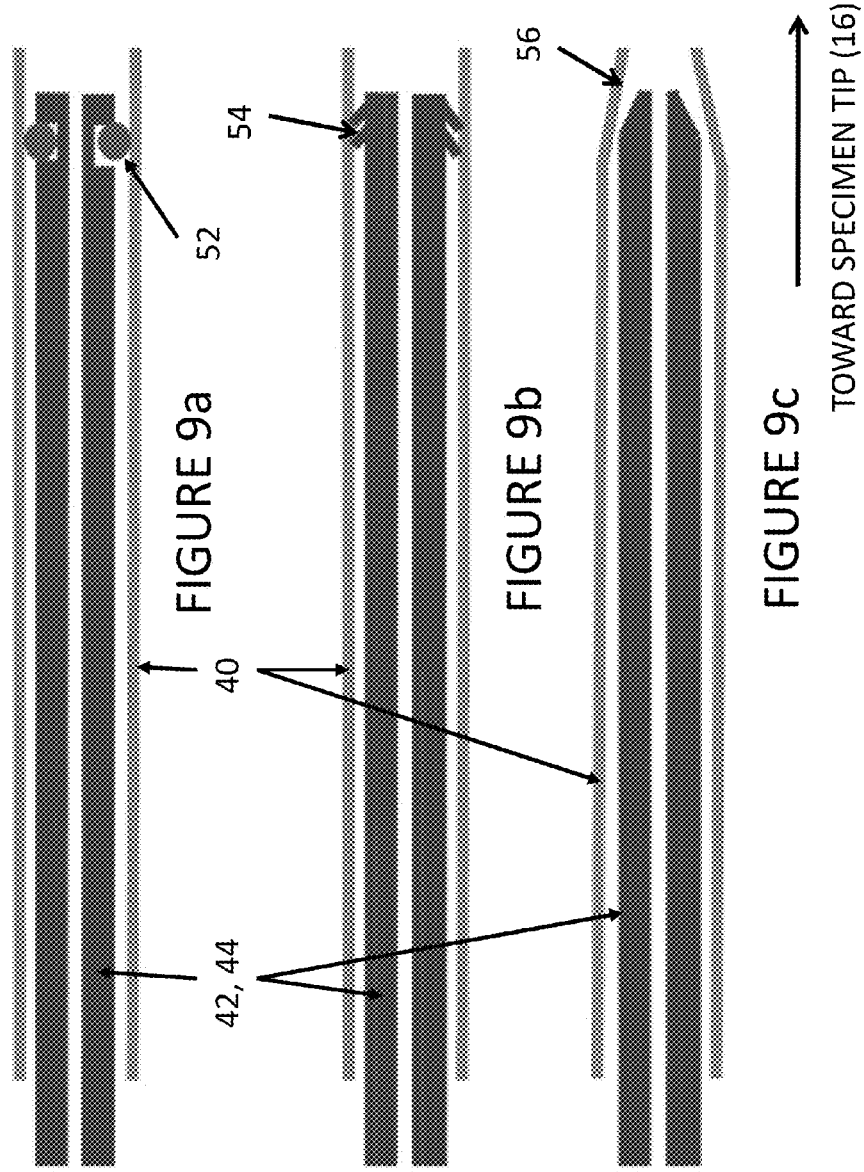

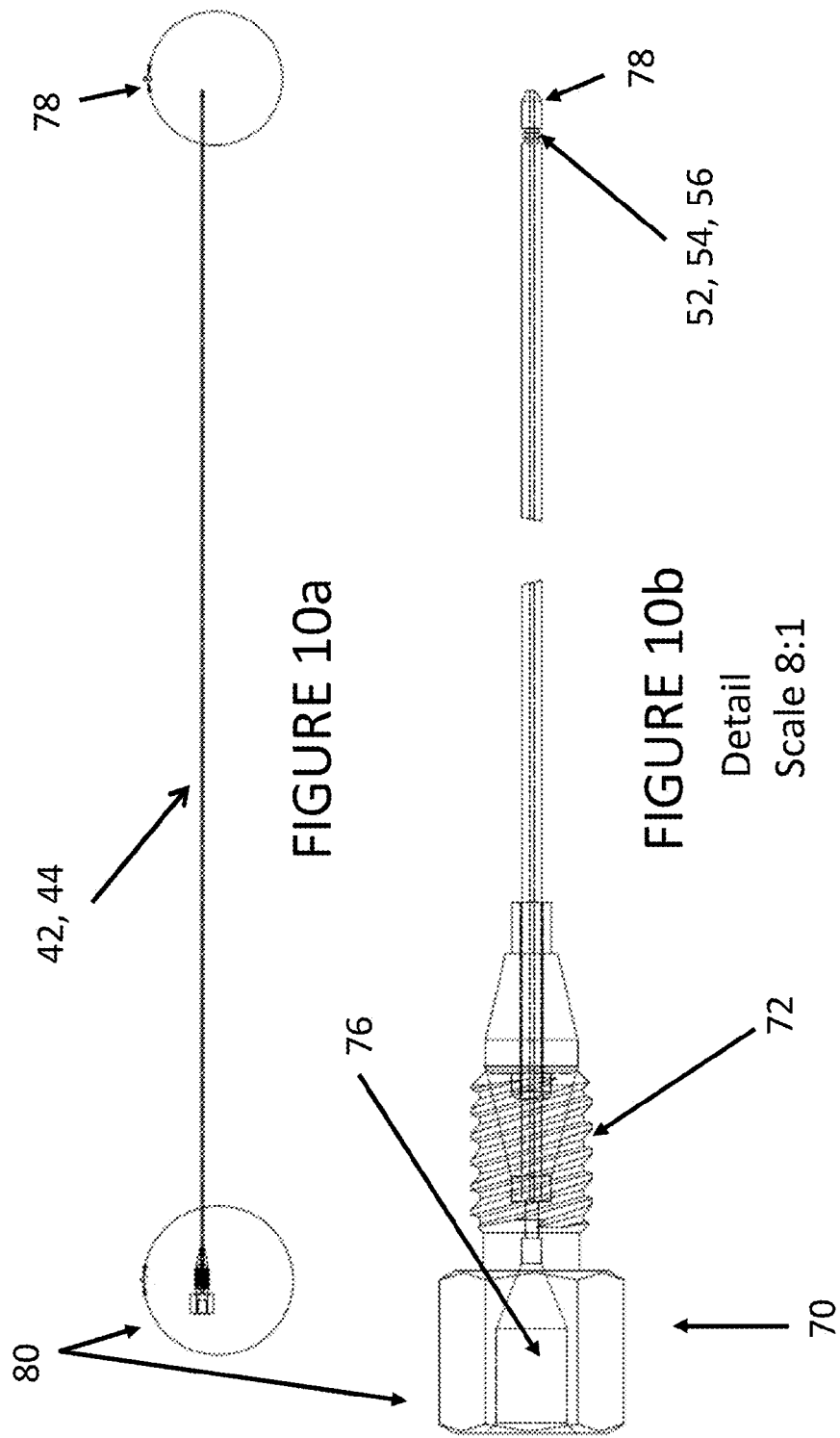

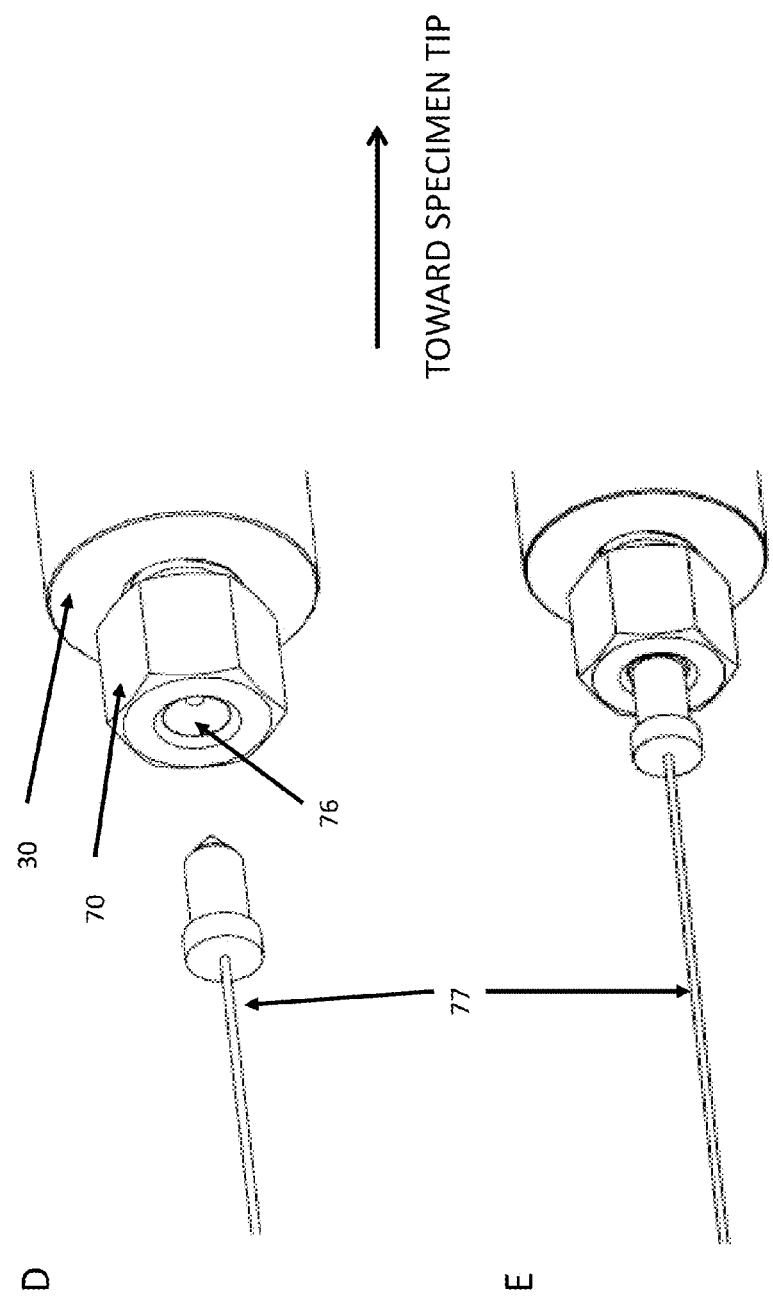

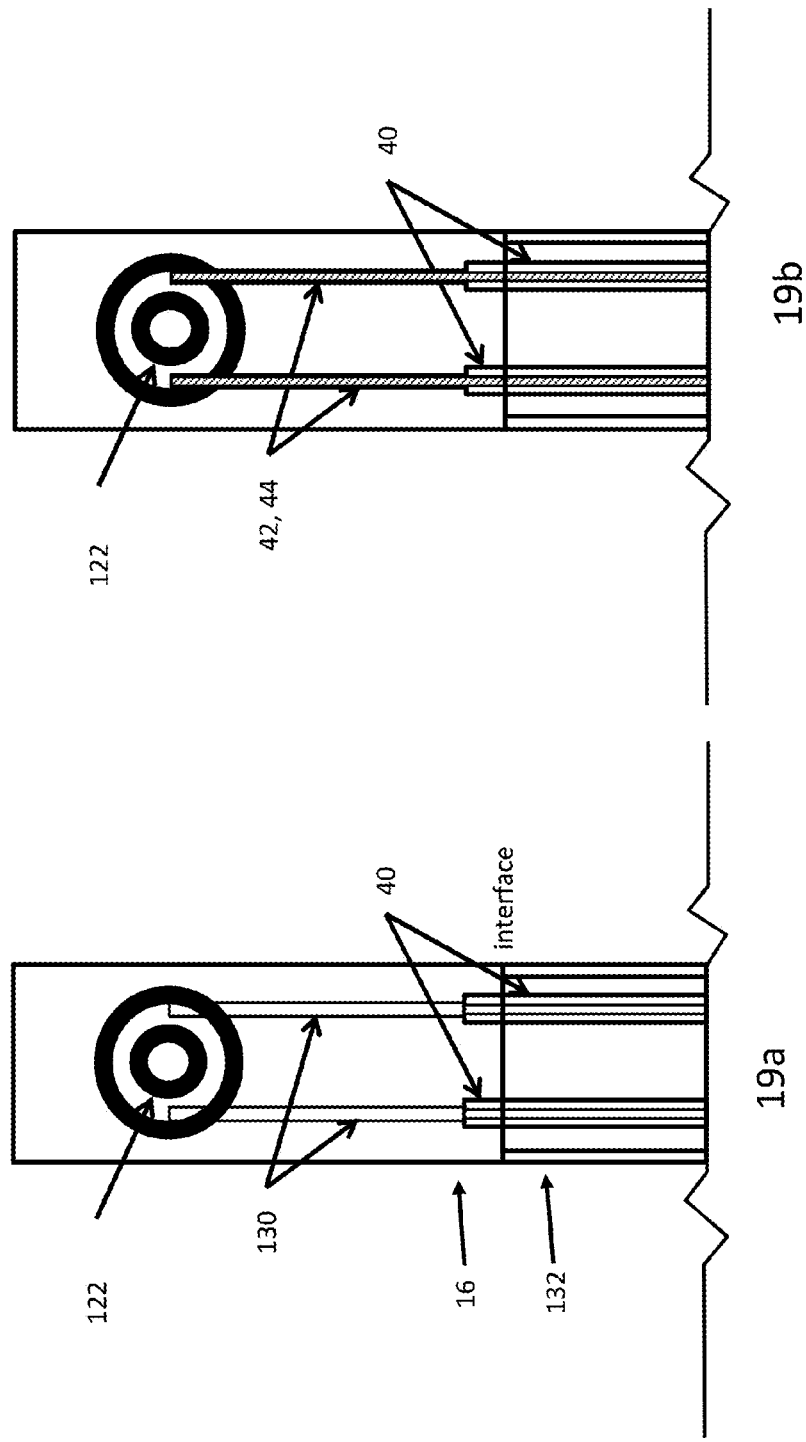

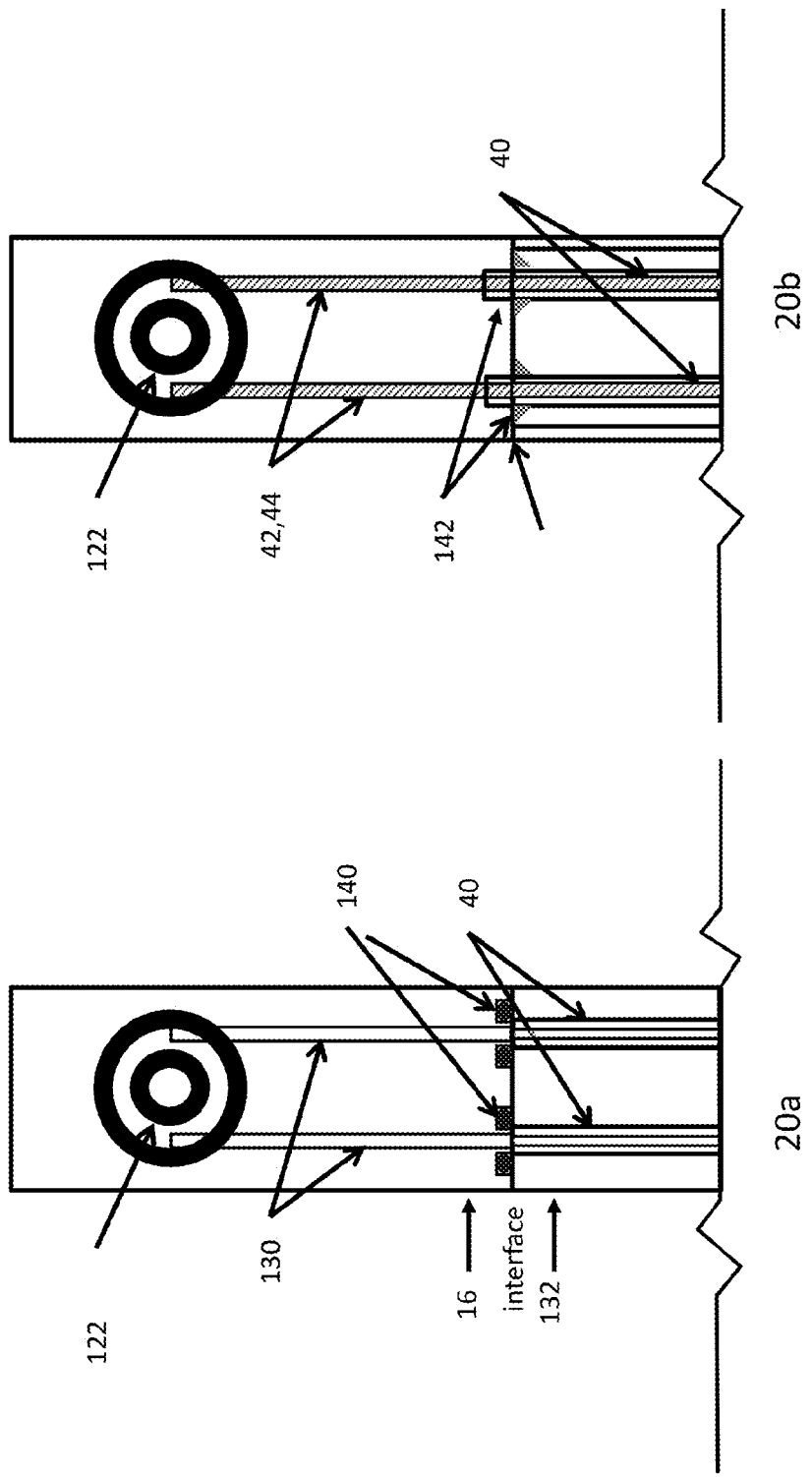

METHOD FOR ENABLING MODULAR PART REPLACEMENT WITHIN AN ELECTRON MICROSCOPE SAMPLE HOLDER

FIELD

The invention relates generally to a method for introducing small form factor objects such as tubing, sensors and other objects to the inside of a sample holder of an electron microscope, e.g., a transmission electron microscope (TEM), a scanning transmission electron microscopy (STEM), and variations of the scanning electron microscopes (SEM) that use traditional TEM-type holders and stages, for imaging and analysis.

BACKGROUND

The sample holder is a component of an electron microscope providing the physical support for samples under observation. Sample holders traditionally used for TEMs and STEMs, as well as some modern SEMs, consist of a rod that is comprised of three key regions: the end, the barrel and the specimen tip. In addition to supporting the sample, the sample holder provides an interface between the inside of the instrument (i.e., a vacuum environment) and the outside world.

To use the sample holder, one or more samples are first placed on a sample support device, e.g., a MEMS device. The sample support device is then mechanically fixed in place at the specimen tip, and the sample holder is inserted into the electron microscope through a load-lock. During insertion, the sample holder is pushed into the electron microscope, assisted by the vacuum within the microscope, until it stops, which results in the specimen tip of the sample holder being located in the column of the microscope. At this point, the barrel of the sample holder bridges the space between the inside of the microscope and the outside of the load lock, and the end of the sample holder is outside the microscope. To maintain an ultra-high vacuum environment inside the electron microscope, flexible o-rings are typically found along the barrel of the sample holder, and these o-rings seal against the microscope when the sample holder is inserted. The exact shape and size of the sample holder varies with the type and manufacturer of the electron microscope, but each holder contains the three aforementioned key regions.

Some sample holders can be used to provide a means for gas or liquid to flow into and out of a cavity at the specimen tip of the holder. To establish temporary or continuous flow of liquid or gas, a pump located external to the sample holder can be used to force liquids into a cavity at the specimen tip of the holder. The pumping equipment is typically outside of the holder, and various connectors are used to bring the liquid or gas to the sample holder, down the length of the holder, to the cavity at the tip of the holder and back out. Use of a pump to flow the liquid is typical, but any method of creating a pressure differential could be used to establish flow. For example, a pressurized reservoir on the entry port or a depressurized reservoir on the exit port(s) would also establish flow.

One type of sample support device is an environmental cell in which (1) two semiconductor devices, i.e., MEMS devices, comprising thin windows can be placed, (2) specimens can be placed on or near the semiconductor devices and (3) using the combination of holder and devices, wherein the specimen's environment, including an electrical field and a gas or liquid flow, can be precisely controlled.

The present inventors previously described novel apparatuses and methods to contact and align devices used to form liquid or gas cells in International Patent Application No. PCT/US2011/46282 filed on Aug. 2, 2011 entitled "ELECTRON MICROSCOPE SAMPLE HOLDER FOR FORMING A GAS OR LIQUID CELL WITH TWO SEMICONDUCTOR DEVICES," which is hereby incorporated herein in its entirety.

The tubing that is used to deliver liquid and/or gas to the tip of the holder will typically be a relatively small tubing with a small inner diameter, such as 200 microns or less. The benefit of using small inner diameters include: minimizing the volume of fluid in the lines in the event of a leak inside the microscope column. Less fluid will theoretically cause less fluid to escape into the microscope column; and reducing the amount of time required to move fluid from the source to the tip of sample area of the holder. For example, if there were to be 100 micro-liters of fluid in the inlet line, a flow rate of 100 micro-liters per hour would require 60 minutes to introduce a fluid to the sample area. Disadvantages of using such small tubing diameters include the tubing can easily become clogged, either through precipitation or trapped particles. This will require user intervention at best and repair of the holder at worse; and the tubing is more difficult to clean because it is limited to flushing as the small size does not easily permit a means to clean with a physical tool.

It would be advantageous to be able to insert and remove temporary fluidic pathways, sensors or other tools without the need to dissemble the holder. Affixing (i.e., sealing) these types of sensors and other tools in place limits the ability to repair or replace them or move them to a different position. However, if larger, pathways or capillaries could be used, there would exist an ideal route to deliver replaceable fluidic pathways (i.e., a tube-within-a-tube design), sensors and other tools to within close proximity of the sample area to measure or apply stimulus to the sample and/or surrounding fluid.

Accordingly, there exists a need in the art for a sample holder that can overcome the aforementioned disadvantages. Towards that end, an apparatus and method is disclosed herein that enables insertion and retraction of modular components within an environmental electron microscope holder. By not requiring disassembly of the sample holder, the vacuum and dimensional specifications of the apparatus can be maintained.

SUMMARY

In one aspect, an electron microscope sample holder is described, said sample holder comprising an end, a barrel, a specimen tip, and at least one capillary that travels from the end of the sample holder along the barrel to the specimen tip, wherein the at least one capillary has an inner diameter that accommodates a small form factor object selected from the group consisting of removable tubing, sensors, tools, electrodes, and combinations thereof.

In another aspect, a small form factor object is described, wherein the small form factor object has a preset length and a first end and a second end, wherein the small form factor object is selected from the group consisting of removable tubing, sensors, tools, electrodes, and combinations thereof, wherein the first end comprises a sensor, electrode, tool, material to be delivered, or an open end of a removable tube, and wherein the second end comprises securing means for securing the small form factor object in an electron microscope sample holder. In one embodiment, the securing means comprise a threaded male member that can be inserted into a complimentary female fitting at the end of the sample holder.

In still another aspect, a method of imaging a sample in an electron microscope is described, said method comprising positioning a sample in a specimen tip of an electron microscope sample holder, inserting the sample holder comprising the sample in an electron microscope, and imaging the sample in the electron microscope, wherein the electron microscope sample holder comprises an end, a barrel, the specimen tip, and at least one capillary that travels from the end of the sample holder along the barrel to the specimen tip, wherein the at least one capillary has an inner diameter that accommodates a small form factor object selected from the group consisting of removable tubing, sensors, tools, electrodes, and combinations thereof.

In yet another aspect, a method of preparing an electron microscope sample holder for imaging is described, said method comprising inserting a small form factor object into a capillary such that a first end of the small form factor object is in close proximity to a sample in a specimen tip of the sample holder, wherein the electron microscope sample holder comprises an end, a barrel, the specimen tip, and at least one capillary that travels from the end of the sample holder along the barrel to the specimen tip, wherein the at least one capillary has an inner diameter that accommodates the small form factor object selected from the group consisting of removable tubing, sensors, tools, electrodes, and combinations thereof.

Other aspects, features and embodiments of the invention will be more fully apparent from the ensuing disclosure and appended claims.

DETAILED DESCRIPTION OF THE FIGURES

FIG. 3b illustrates another prior art apparatus for attaching external tubing (12) to the at least one capillary (14) of a sample holder using tubing connectors (20).

FIG. 4b illustrates an apparatus comprising at least one capillary (40) with an inner diameter that allows sensors or other small form factor devices (44) to be inserted and removed.

FIG. 5a illustrates an embodiment of an apparatus wherein the at least one capillary is shown without the removable tubing of other small form factor object inserted.

FIG. 8a illustrates an embodiment of a seal (52), which is an O-ring that is positioned at some point along the small form factor object (42, 44).

FIG. 8b illustrates the seal (52) of FIG. 8a, wherein it can be seen that the internal fluid (60) cannot flow past the seal (52).

FIG. 9a illustrates sealing with an o-ring (52).

FIG. 9b illustrates sealing with a flared tubing or barbed seal (54).

FIG. 9c illustrates sealting with a compressed ferrule or swaged compression seal (56).

FIG. 10a illustrates an embodiment of a preset length small form factor object.

FIG. 10b illustrates reference numbers 78 and 80 of FIG. 10a in an exploded view (8:1) for better clarity of the two ends of the small form factor object.

FIG. 19a shows the specimen tip (16) of the sample holder where the at least one capillary is terminated and a fluidic pathway (130) extends to the fluidic reservoir (122).

FIG. 19b illustrates the design of FIG. 19a with the removable tubing (42) or small form factor object (44) inserted.

FIG. 20a illustrates an embodiment of a method to seal the at least one capillary (40) to the specimen tip (16) of the holder.

FIG. 20b illustrates another embodiment of a method to seal the at least one capillary (40) to the specimen tip (16) of the holder.

DETAILED DESCRIPTION

Figure 1:
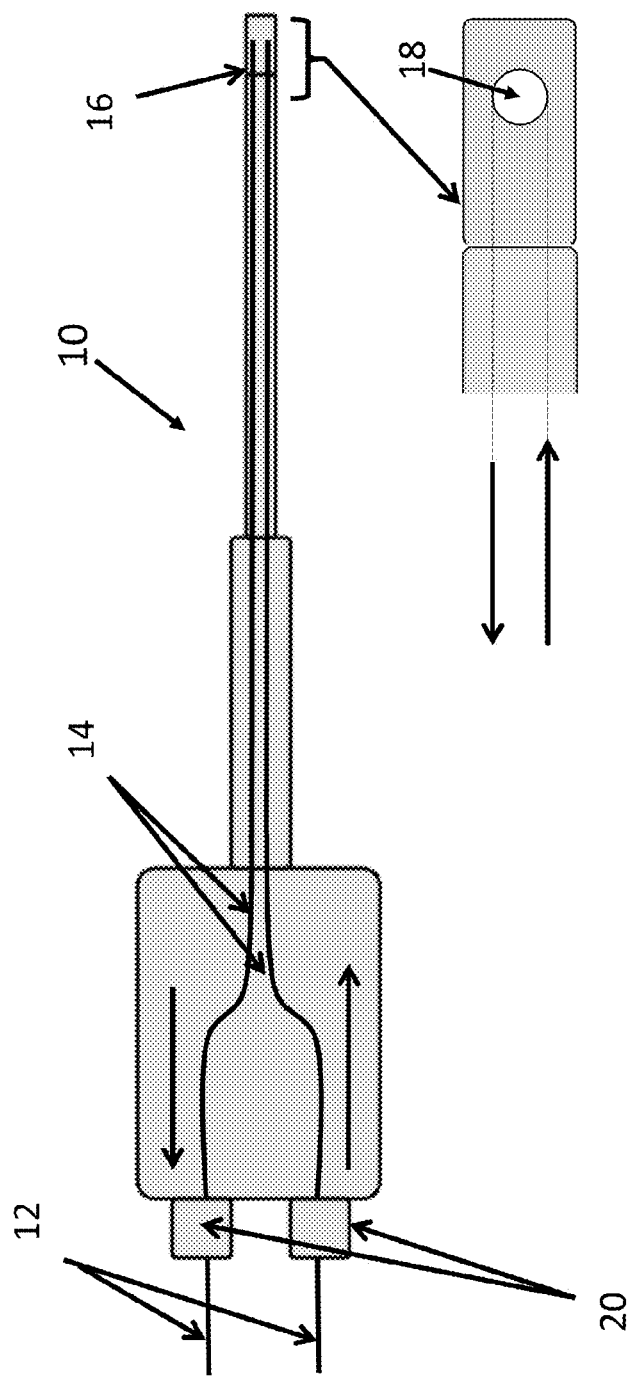
FIG. 1 illustrates a general depiction of a two port closed cell electron microscope (EM) sample holder.

An electron microscope sample holder is described herein, said sample holder comprising an end, a barrel, a specimen tip, and at least one capillary that travels from the end of the sample holder along the barrel to an area in substantial proximity to the specimen tip, wherein the at least one capillary has an inner diameter that accommodates at least one small form factor object selected from the group consisting of removable tubing, sensors, tools, electrodes, and combinations thereof. The at least one small form factor object has an outer diameter that is less than the inner diameter of the at least one capillary so the at least one small form factor object can be inserted into and removed from the at least one capillary.

It is to be understood that the sample holder and sample holder interface described herein are compatible with and may be interfaced with the sample support devices, e.g., semiconductor sample support devices, disclosed in International Patent Application Nos. PCT/US08/63200 filed on May 9, 2008, PCT/US11/46282 filed on Aug. 2, 2011, and PCT/US08/88052 filed on Dec. 22, 2008, which are all incorporated herein by reference in their entireties. It should also be appreciated by one skilled in the art that alternative sample support devices may be interfaced with the sample holder described herein. The sample holder provides mechanical support for one or more samples or sample support devices and also provides other stimuli (e.g., temperature, electricity, mechanical, chemical, gas or liquid, or any combination thereof) to the samples or sample support devices. The sample holder can be manufactured with tips, barrels and ends of various shapes and sizes such that the sample holder fits any manufacturer's electron microscope.

As defined herein, a "capillary" includes, but is not limited to, a permanent tube provided in the sample holder at the time of use, for example, a tube made of polymeric material or metal including, but not limited to, stainless steel 316, stainless steel 303, stainless steel 304, nickel, nickel alloys, fused silica, polyether ether ketone (PEEK), and polytetrafluoroethylene (PTFE). Alternatively, the capillary can be a bore hole through the metal and/or plastic portions of the sample holder. The capillary preferably has an inner diameter of less than about 1000 microns, preferably less than about 900 microns. In one embodiment, the sample holder comprises one capillary. In another embodiment, the sample holder comprises two capillaries. In still another embodiment, the sample holder comprises three capillaries. More than three capillaries is contemplated, as readily determined by the person skilled in the art.

As defined herein, "small form factor objects" are defined as an object of appropriate size that can be easily inserted into or removed from the catheter pathway, i.e., the at least one capillary, unobstructed. Examples of small form factor objects include, but are not limited to, electrodes, sensors, replacement/removable tubing, tools and solid materials. If the at least one capillary has an inner diameter of at least 1000 microns, the small form factor object will have an outer diameter that is less than 1000 microns, for example, less than 800 microns. It should be understood that the "outer diameter" corresponds to the portion of the small factor form object having the largest dimensions, whether circular or otherwise. For example, a small form factor object may have a sensor at an end that has a diameter of less than 800 microns that is attached to a length of wire having a diameter that is less than the diameter of the sensor.

As used herein, a "sample support device" corresponds to a structure that holds a sample for microscopic imaging. A sample support device can provide an experimental region. Devices may include one, more than one or even an array of experimental regions and may include integrated features such as electrodes, thermocouples, and/or calibration sites, as readily determined by one skilled in the art. One preferred embodiment includes sample support devices made with MEMS technology having thin membrane regions (continuous or perforated) for supporting a sample in the experimental region. Sample support devices include, but are not limited to, a window device, an electrical device and a heating device. The sample support devices can provide electrical contacts or electrodes for connection to electrical leads. The sample support devices can also contain features to route electrical signals to the experimental region(s). Alternatively, the sample support device can be a standard 3 mm grid or other common electron microscopy support used in traditional open cells.

As defined herein, a "membrane region" on the sample support device corresponds to unsupported material comprising, consisting of, or consisting essentially of carbon, silicon nitride, SiC or other thin films generally 1 micron or less having a low tensile stress (<500 MPa), said membrane region being at least partially electron transparent region and capable of supporting the at least one sample. The membrane region may include holes or be hole-free. The membrane region may be comprised of a single material or a layer of more than one material and may be either uniformly flat or contain regions with varying thicknesses.

As defined herein, a "cell" corresponds to a region defined by two substantially parallel positioned sample support devices, wherein at least one liquid and/or gas can be flowed therethrough. A sample can be positioned within the cell for imaging purposes. A cell can comprise two window devices, one window device and one electrical device, one window device and one thermal device, or two electrical devices.

As defined herein, "sample" means the object being studied in the electron microscope, typically placed within the cell or on the sample support device in the region of liquid or gas control which is at least partially electron transparent (e g , nanoparticle, catalyst, thin section, etc.). It should be appreciated that the sample can be placed on a sample support device in an open sample holder, i.e., not a closed cell.

As defined herein, a "pocket" corresponds to a space in the specimen tip of the sample holder that defines the vertical walls of the cell, into which the two substantially parallel sample support devices are positioned to form the cell.

As defined herein, "window device" means a device used to create a physical, electron transparent barrier on one boundary and the vacuum environment of the electron microscope on the other and is generally a silicon nitride-based semiconductor micro-machined part, although other semiconductor materials are contemplated.

As defined herein, "semiconductor" means a material, such as silicon, that is intermediate in electrical conductivity between conductors and insulators.

As defined herein, "temperature control device" or "thermal device" means a device used to control the temperature around the specimen either individually or within a cell and is generally a semiconductor micro-machined part, e.g., a silicon carbide-based material. In a preferred embodiment, the thermal device comprises a membrane comprising at least one membrane region and at least one conductive element in contact with the membrane forming a heatable region of the membrane.

As defined herein, "elastomeric" corresponds to any material that is able to resume its original shape when a deforming force is removed. Elastomers are polymeric and have a low Young's modulus and a high yield point. At room temperature, elastomers tend to be soft and flexible.

The general area of "in situ" electron microscopy involves applying stimulus to a sample during imaging. The stimulus could be thermal (heating or cooling), electrical (applying a voltage or current), mechanical (applying stress or strain), chemical (containing a sample in a specific chemical environment), or several of these at once.

As defined herein, a "fluid" can be a liquid and/or gas.

The apparatus described herein is an electron microscope sample holder that includes at least one capillary having a sufficient inner diameter to act as a catheter pathway that allows objects that can be accommodated within the at least one capillary to be replaced or swapped with other small form factor objects including, but not limited to:

1.) smaller tubing—for example if the at least one capillary has an inner diameter of 890 microns, a removable tube having an outer diameter of less than 750 microns can easily be inserted and removed. It should be appreciated that the removable tubing can be circular or any other polygonal shape that can be easily accommodated in the permanent tubing. This allows for much smaller inner diameters to enable fast fluid delivery and reduced fluidic volume in case of a leak. In the event of a clog or contamination, the 750 micron tubing can simply be removed and replaced.

2.) Sensors—for example at least one capillary with inner diameter of 890 microns will allow for a variety of fiber optic or electronic sensors that would otherwise be too large to fit within tubing with a smaller diameter.

3.) Electrodes—for example, in electrochemistry, a type of electrode with a stable and known electrical potential, known as a reference electrode, may be desired. The type of reference electrode will depend on the type of experimentation, so it is desired to be able to change the electrode depending on the circumstances. Another type of electrode is one simply used to carry current to or from the sample area of the holder to create an electrical bias across the sample.

4.) Tools—An example of a simple tool is a stiff shaft or wire that could be used to mechanically remove contamination or debris from the at least one capillary pathway. Another example of a tool is a stiff line with a micro-manipulating probe at the end that can mechanically interact with the sample within the fluid in the closed cell.

5.) Solid Materials—An example of solid material could be a solid material affixed to the end of a stiff shaft or wire, that when inserted into the at least one capillary pathway, could dissolve into the fluid solution to change the properties of the fluid, such as pH or a chemical reaction in the closed cell.

Figure 2:
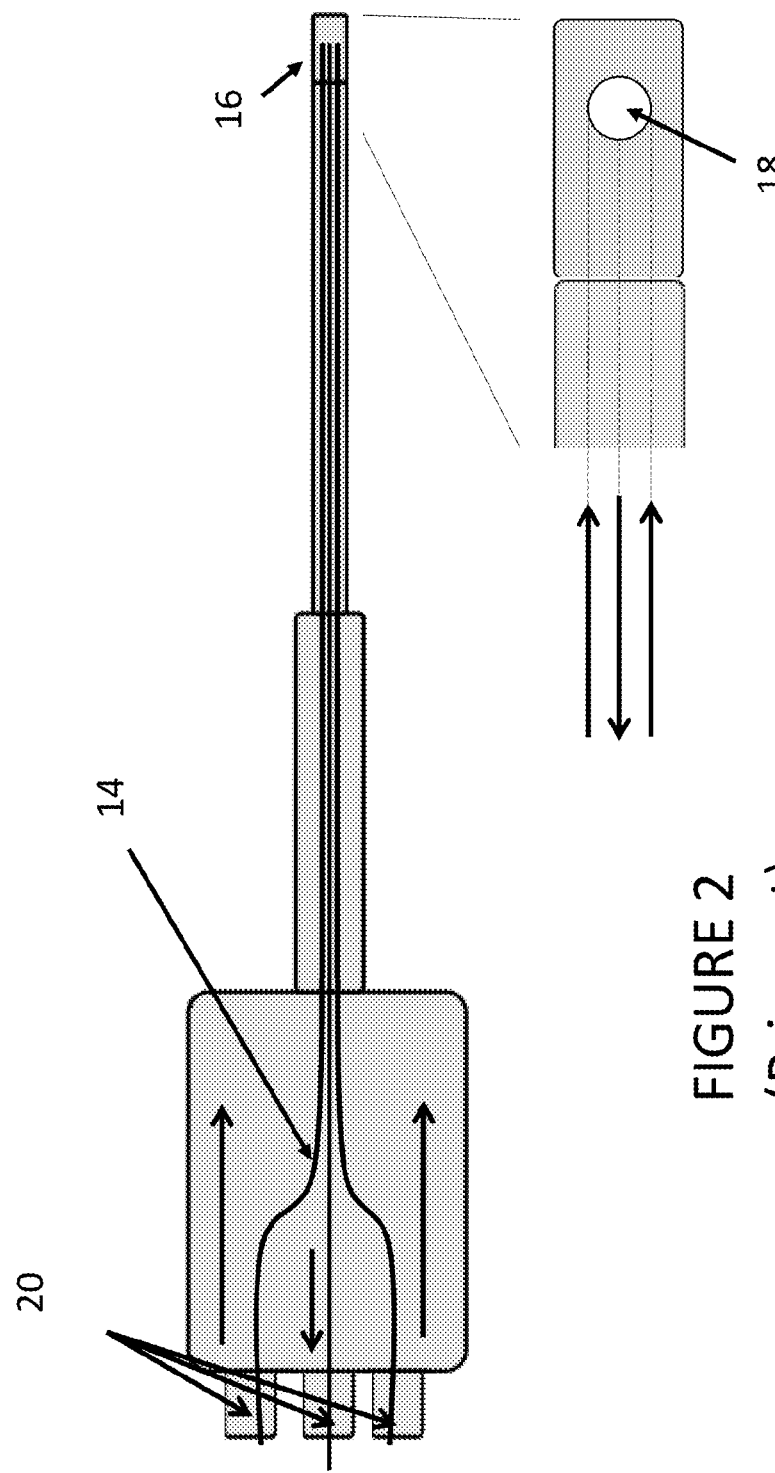
FIG. 2 illustrates a general depiction of a three port closed cell electron microscope (EM) sample holder.

FIGS. 1 and 2 show a general depiction of a two port closed cell electron microscope (EM) sample holder (10) and a three port closed cell electron microscope (EM) sample holder (11), respectively, wherein the sample holder includes capillaries (14) inside the holder (10) that travel to and from the closed cell (18) at the specimen tip (16). The placement of the at least one capillary is just for general illustration and is not intended to limit the holder in any way. The at least one capillary (14) permits fluids, e.g., gases or liquids, to travel from the external tubing (12) to the closed cell (18), for in situ analysis of the sample positioned in the closed cell. The sample holder includes tubing connectors (20).

Figure 3A:
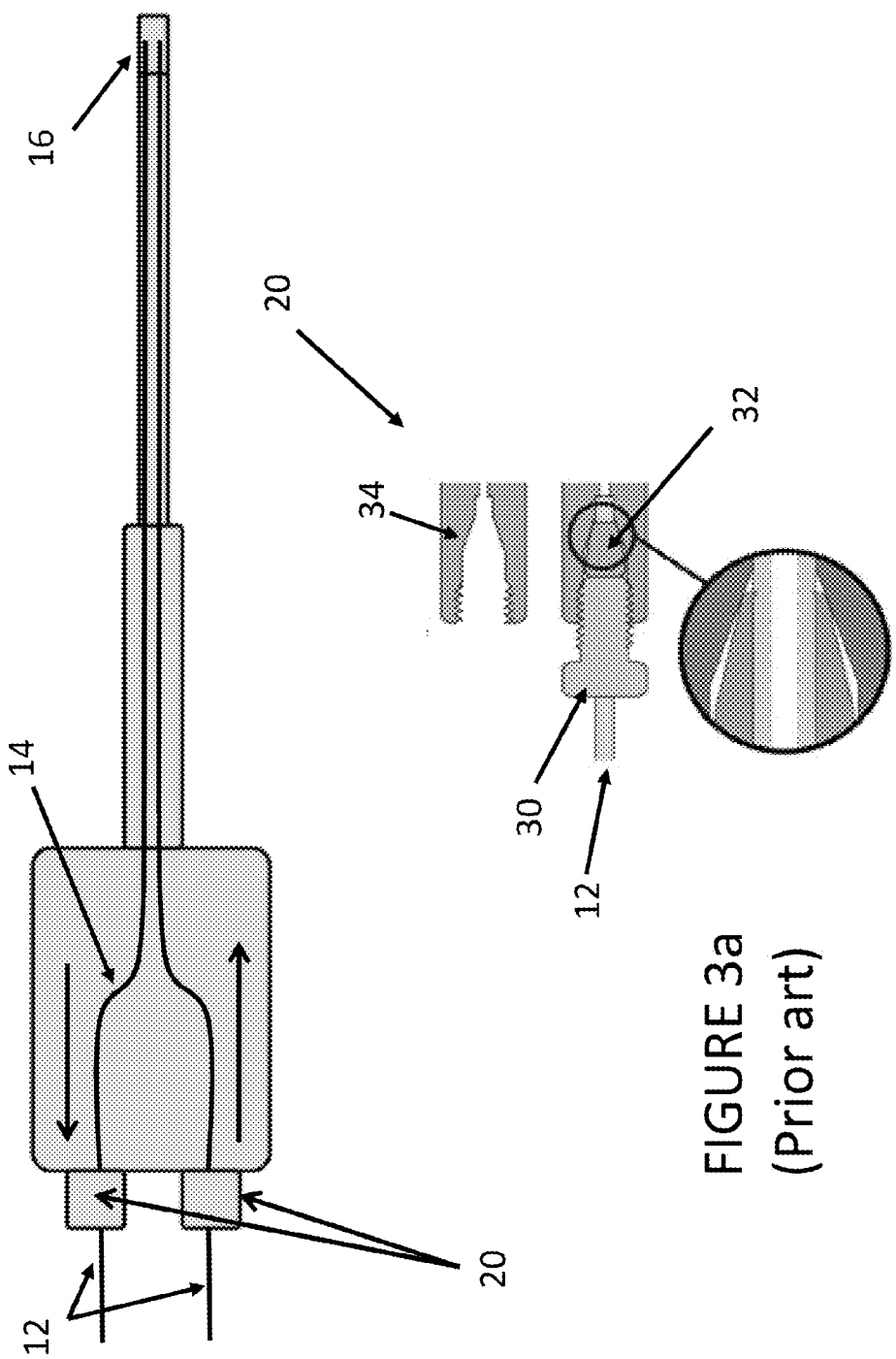
FIG. 3a illustrates a prior art apparatus for attaching external tubing (12) to the at least one capillary (14) of a sample holder using tubing connectors (20).

FIGS. 3a and 3b illustrate a prior art apparatus for attaching external tubing (12) to the at least one capillary (14) of the sample holder using tubing connectors (20), said tubing connectors comprising fittings (30), ferrules (32) and an adaptor (34). It should be appreciated by the person skilled in the art that the adaptor (34) in FIG. 3b is the connector (20) emerging from the back of the sample holder, for example, in FIGS. 1-3a.

Figure 4A:
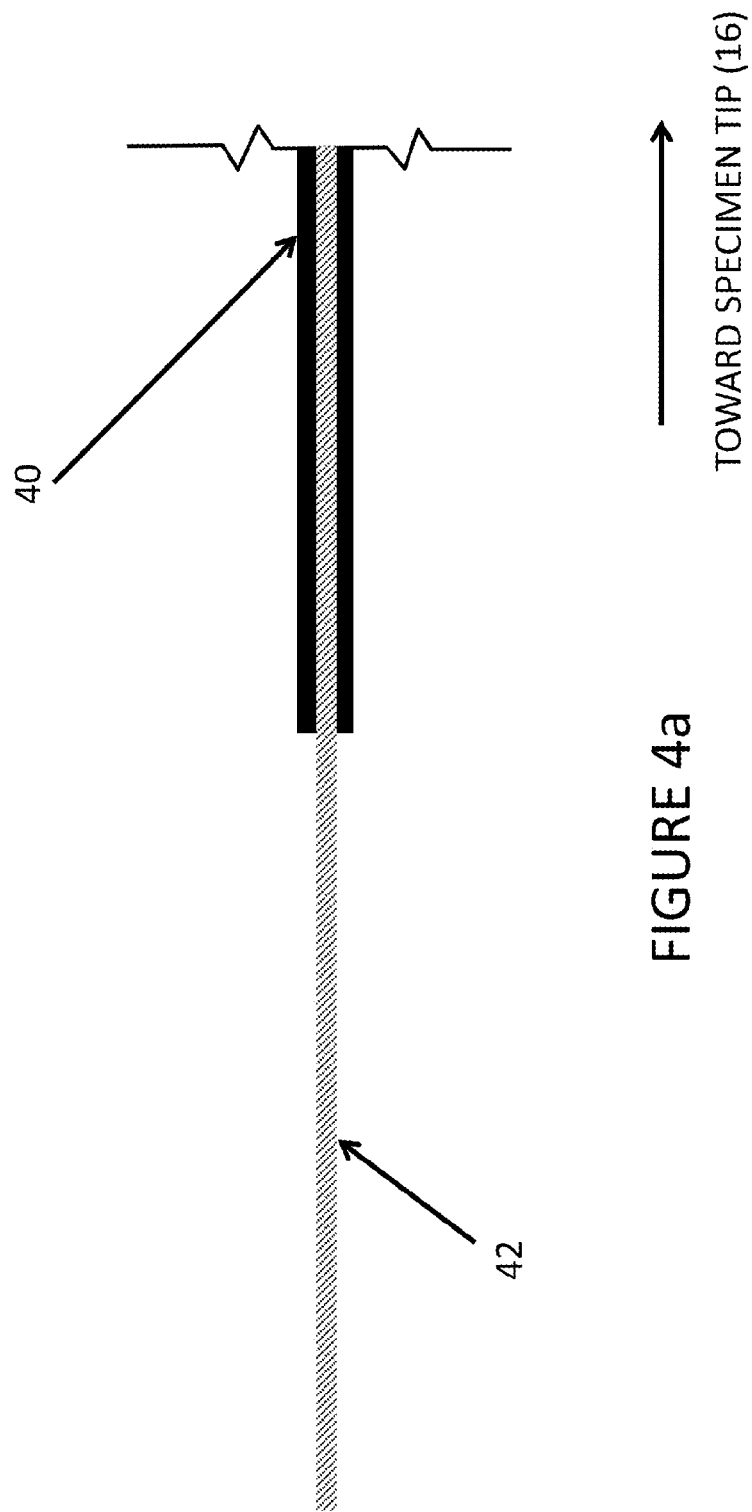
FIG. 4a illustrates an apparatus comprising at least one capillary (40) that is affixed within the sample holder, said capillary(s) having an inner diameter that allows smaller tubing (42) to be inserted and removed.

FIG. 4a illustrates a design of the apparatus described herein using at least one capillary (40) that is affixed within the sample holder, said capillary(s) having an inner diameter that allows smaller tubing (42) to be inserted and removed. Although not shown in FIG. 4a, it should be appreciated by the person skilled in the art that the end of at least one capillary is flush with the end of the sample holder (see, e.g., FIG. 4c) or alternatively emerges from the end of the sample holder (see, e.g., FIG. 4d).

FIG. 4b illustrates a design of using at least one capillary (40) with an inner diameter that allows sensors or other small form factor devices (44) to be inserted and removed. Although not shown in FIG. 4b, it should be appreciated by the person skilled in the art that the end of at least one capillary is flush with the end of the sample holder (see, e.g., FIG. 4c) or alternatively emerges from the end of the sample holder (see, e.g., FIG. 4d).

Figure 4C:
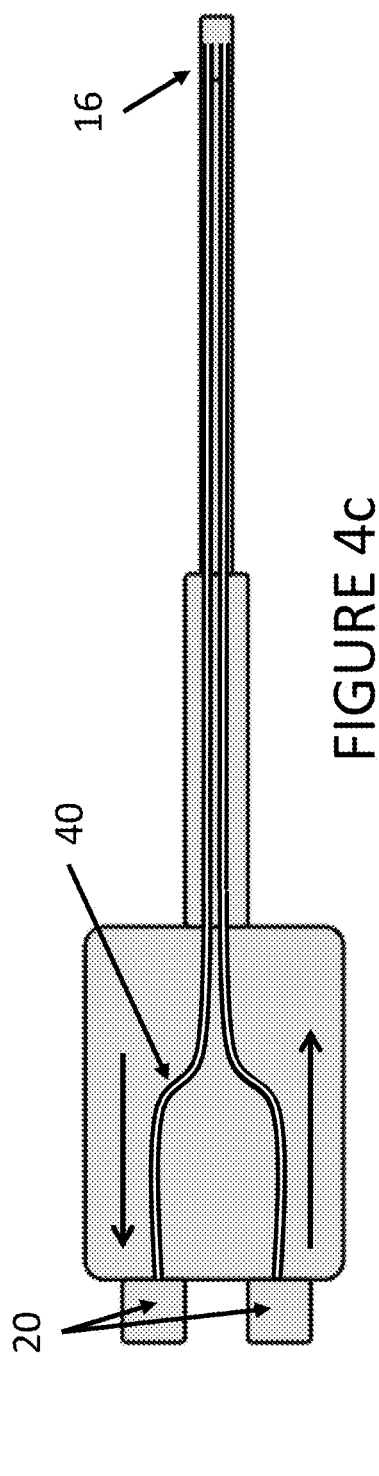
FIG. 4c illustrates the electron microscopy sample holder with at least two capillaries (40) of sufficient inner diameter that are capable of accepting removable tubing or other small form factor object.

FIG. 4c illustrates the electron microscopy sample holder with at least two capillaries (40) of sufficient inner diameter that are capable of accepting removable tubing or other small form factor object. In this case, the at least one capillary is flush with the sample holder. As introduced herein in the definition section, the at least one capillary can be a bore hole from the end of the holder through the barrel to the specimen tip or it can be a permanent tube provided in the sample holder, e.g., in a bore hole to be inserted by the manufacturer, preferably the at least one permanent tube. Regardless, the at least one capillary is of a sufficient diameter to accommodate the small form factor object. It should be appreciated when there are two or more capillaries, the small form factor objects to be inserted in each respective capillary may be the same as or different from one another.

Figure 4D:
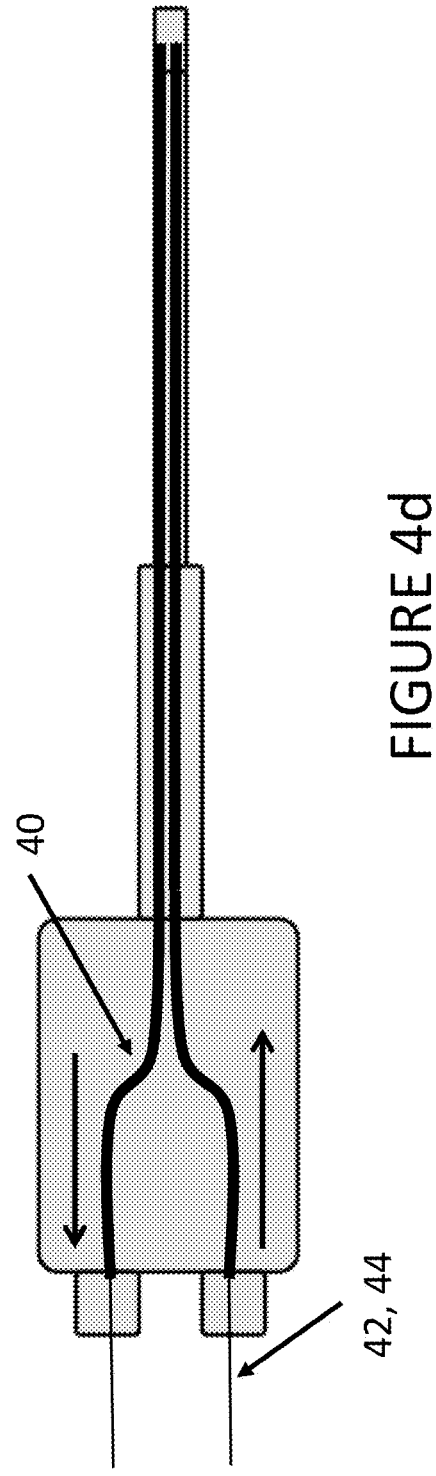
FIG. 4d illustrates the electron microscopy sample holder with removable tubing (42) or other small form factor object (44) inserted within the at least one capillary (40) of FIG. 4c.

FIG. 4d illustrates the electron microscopy holder with removable tubing (42) or other small form factor object (44) inserted within the at least one capillary (40). In this case, the at least one capillary emerges from the sample holder.

Figure 5B:
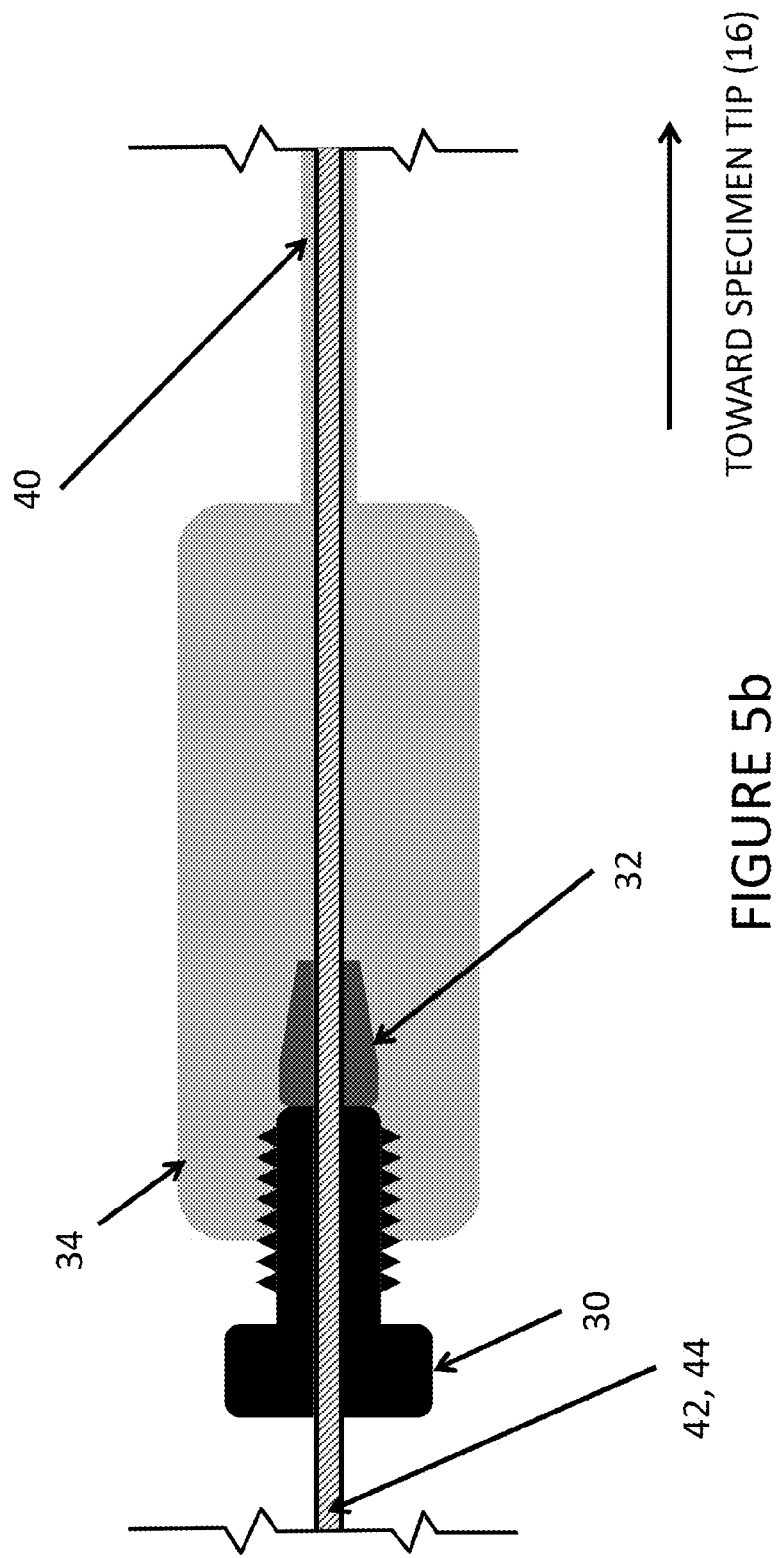
FIG. 5b illustrates the apparatus of FIG. 5a with the removable tubing (42) or small form factor object (44) inserted into the at least one capillary (40).

FIG. 5a illustrates an embodiment of the apparatus described herein wherein the at least one capillary is shown without the removable tubing of other small form factor object inserted. FIG. 5b illustrates the apparatus of FIG. 5a with the removable tubing (42) or small form factor object (44) inserted (hatched line). The apparatus of FIGS. 5a-5b allows the user to insert a removable tube or small form factor object of any length which can be secured using the compression ferrule (32). It should be appreciated by the person skilled in the art that the adaptor (34) in FIGS. 5a-5b is the connector (20) emerging from the back of the sample holder, for example, in FIGS. 1-3a. Accordingly, in this embodiment, the removable tube or small form factor object emerged from the sample holder at the connectors (20).

Figure 6A:
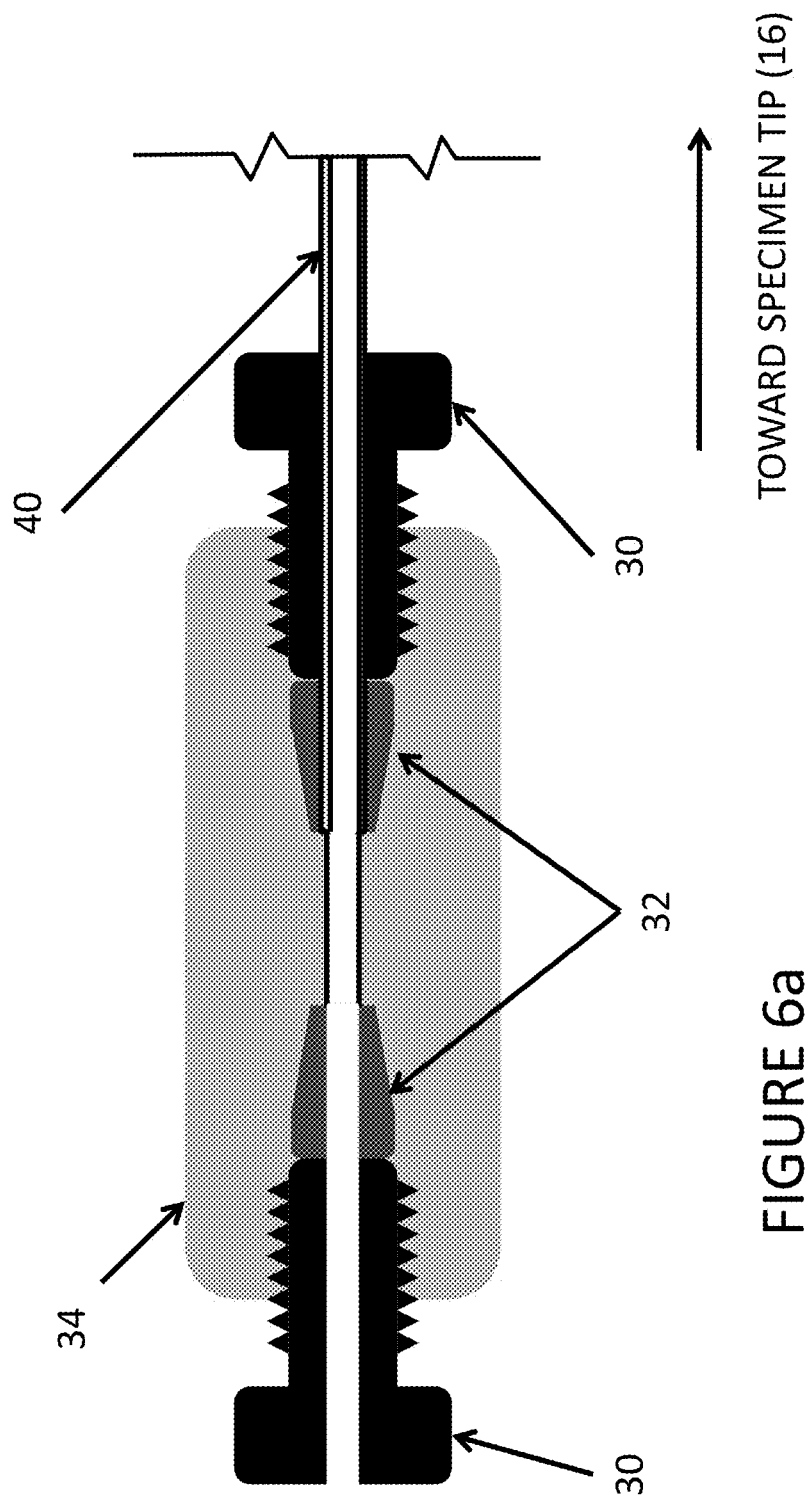
FIG. 6a illustrates another embodiment of a method of affixing both the at least one capillary (40) and the removable tubing, wherein the removable tubing is not inserted.
Figure 6B:
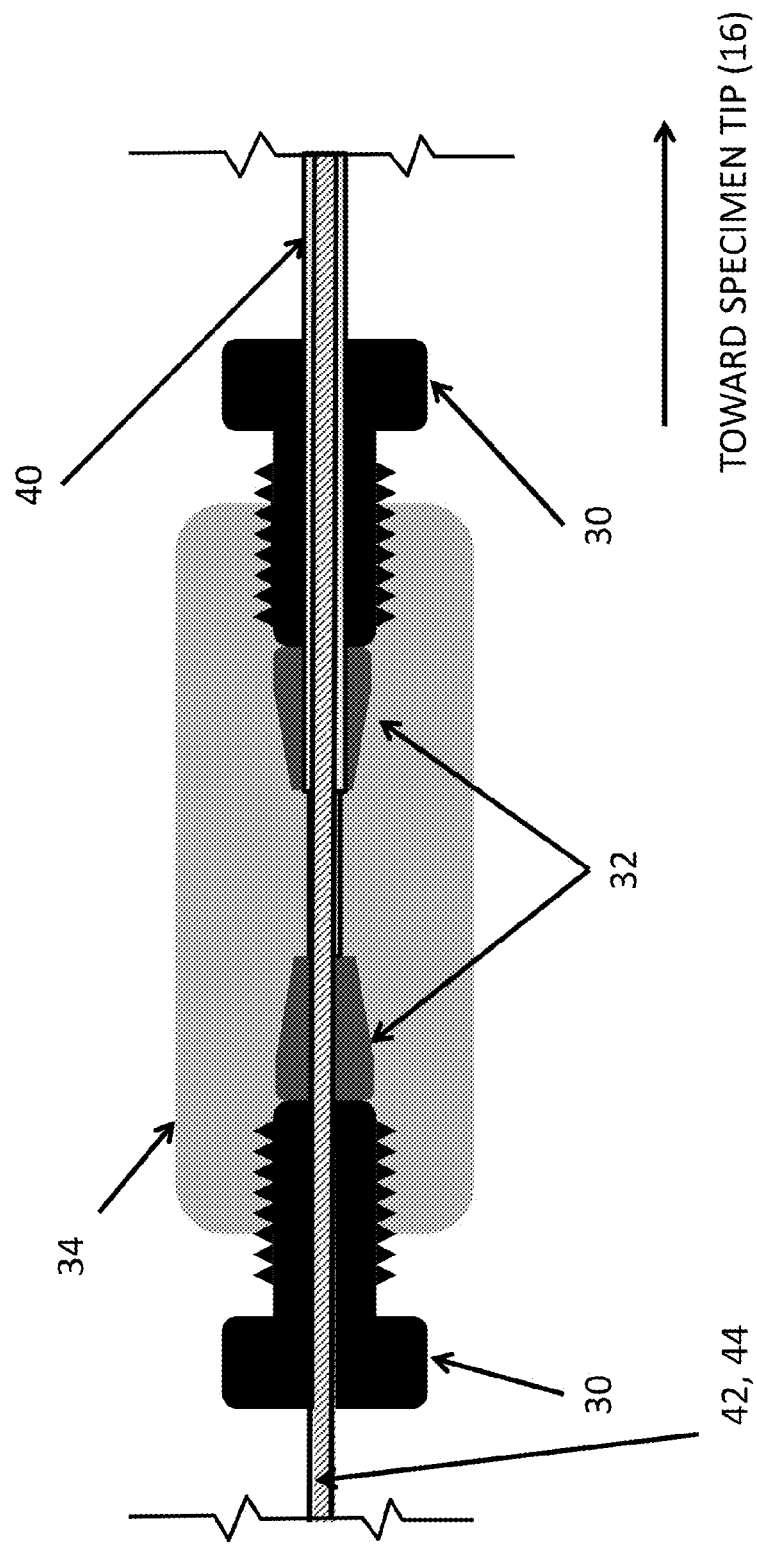
FIG. 6b illustrates the apparatus of FIG. 6a with the removable tubing (42) or small form factor object (44) inserted.

FIG. 6a illustrates another embodiment of the method of affixing both the at least one capillary (40) and the removable tubing. This design has the advantage of allowing the user to remove the at least one capillary (40) from the adaptor (34). FIG. 6a illustrates the assembly without the removable tubing inserted. FIG. 6b illustrates the apparatus of FIG. 6a with the removable tubing (42) or small form factor object (44) inserted. The apparatus of FIGS. 6a-6b allows the user to insert a removable tube or small form factor object of any length which can be secured using the compression ferrule (32). It should be appreciated by the person skilled in the art that the adaptor (34) in FIGS. 6a-6b is the connector (20) emerging from the back of the sample holder, for example, in FIGS. 1-3a. Accordingly, in this embodiment, the removable tube or small form factor object emerged from the sample holder at the connectors (20).

Considering FIGS. 4-6 illustrated and described herein, it can be seen that the removable tubing and other small form factor objects can be inserted into, and removed from, the at least one capillary. This allows the user to replace the removable tubing and the small form factor objects rather than dealing with cleaning the tubing and/or unclogging the tubing. Further, surprisingly, the present inventors were able to insert electrodes, sensors, tools and/or solid materials into the at least one capillary to perform analysis and/or experiments in proximity of the sample in the specimen tip of the sample holder.

Advantageously, the small form factor objects are designed to form a seal against the at least one capillary to minimize or prevent backflow of the liquid and/or gas into the at least one capillary, as described hereinbelow.

Figure 7:
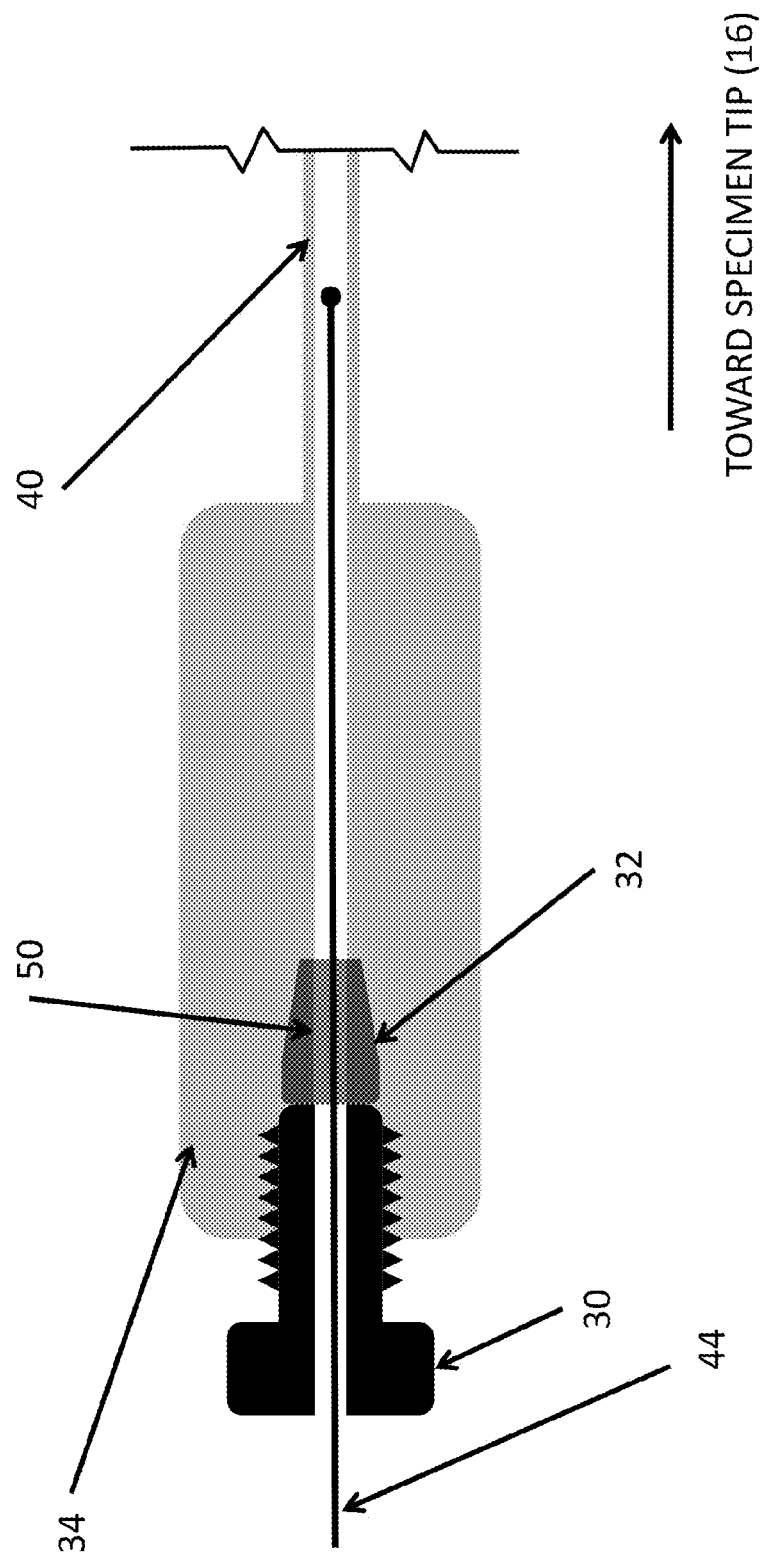
FIG. 7 illustrates an embodiment of a seal (50) wherein the insertable small form factor object, such as a sensor, could be temporarily sealed at the entrance to the holder.

FIG. 7 illustrates an embodiment of a seal (50) wherein the insertable small form factor object (44), such as a sensor, could be temporarily sealed at the entrance to the holder. In this embodiment, the seal in provided within the tube attachment apparatus, i.e., the adaptor, ferrule, fitting and apparatus. By sealing the shaft of the small form factor object (44) within the ferrule (32), a temporary seal can be created with a tradition ferrule (32) and fitting (30). It should be appreciated by the person skilled in the art that the adaptor (34) in FIG. 7 is the connector (20) emerging from the back of the sample holder, for example, in FIGS. 1-3a.

FIG. 8 illustrates another sealing embodiment. In FIG. 8a, the seal (52) is an O-ring that is positioned at some point along the small form factor object (42, 44). Upon insertion of the at least one small form factor object (42, 44) in the at least one capillary (40), a seal is provided through elastomeric compression. The position of the seal (52) can be anywhere along the length of the small form factor object (42, 44), as readily understood by the person skilled in the art, so long as backflow away from the specimen tip back into the barrel is prevented or minimized. An example of the seal (52) illustrated in FIG. 8a is shown in FIG. 8b, wherein it can be seen that the internal fluid (60) cannot flow past the seal (52).

Alternative sealing embodiments are provided in FIG. 9, wherein the seal is positioned at some point on the small form factor object. Sealing embodiments includes, but are not limited to, an o-ring (52) (FIG. 9a), a flared tubing or barbed seal (54) (FIG. 9b), or a compressed ferrule or swaged compression seal (56) (FIG. 9c). Regardless of the sealing embodiment used, the seal can be positioned where the small factor form object emerges from the at least one capillary or anywhere within the at least one capillary.

Another advantage of the present apparatus and method of use is that the small form factor object can be a preset length providing for a precise location of the sealing means and the sensors, electrodes, tools and/or solid materials when inserted into the at least one capillary.

Figure 11:
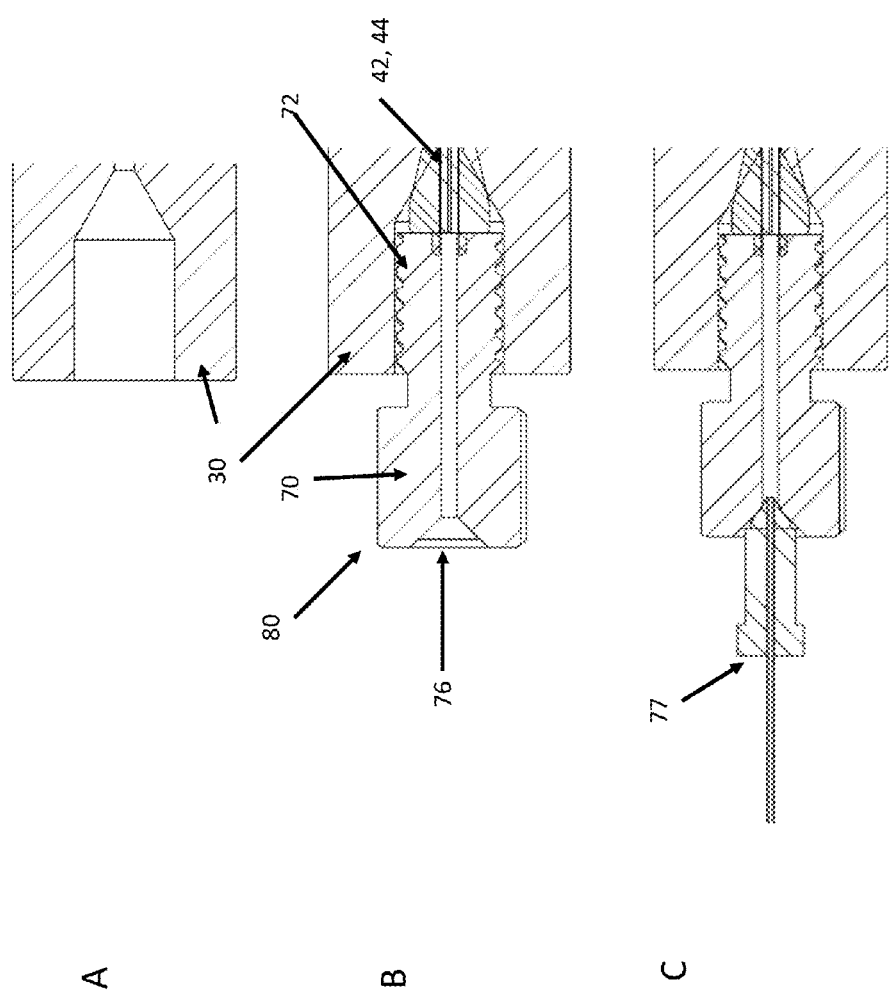
FIG. 11A illustrates a cross section of the fitting (30) of the sample holder.
FIG. 11B illustrates a cross section of the securing means (70) of the preset length small form factor object being inserted into the fitting (30) of FIG. 11A.
FIG. 11C illustrates a cross section of external electronics or fluid housings (77) being inserted into the connection point (76) of the securing means of FIG. 11B.
FIG. 11D illustrates an elevation view of the connection point (76) of the securing means (70).
FIG. 11E illustrates the external electronics or fluid housings (77) being inserted into the connection point (76) of the securing means of FIG. 11D.

An embodiment of a preset length small form factor object is shown in FIG. 10a, wherein the length of the small form factor object is dictated by the make and model of the sample holder and where one end of the small form factor object is going to be positioned relative to the specimen tip. FIG. 10b represents an exploded view (8:1) of the circled ends 78 and 80 of the small form factor object of FIG. 10a. In FIG. 10b, a first end (78) of the small form factor object includes a sealing means (52, 54, 56) as well as the specific sensor, electrode, tool, or material to be delivered (not shown in specificity). Alternatively, when the small form factor object is replaceable tubing, the first end (78) is an open tube. It should be appreciated by the person skilled in the art that the sealing means (52, 54, 56) are not required to be in proximity to the first end, as shown in FIG. 10b, but can be positioned anywhere along the length of the small factor form object (42,44). The second end (80) of the small form factor object includes a securing means (70). The securing means is insertable into a fitting (30) on the sample holder such that the male securing means (70) is compatible with the female fitting (30) in the sample holder (see, e.g., FIGS. 11A-B). In the embodiment shown in FIG. 10b, the securing means (70) comprises a threaded member (72) that allows the user to screw the small form factor object (42, 44) into the fitting (30) of the sample holder upon insertion into a capillary. The securing means (70) ensures that the small form factor object (42, 44) is positioned properly for sealing as well as for positioning of the object at the first end (78) (e.g., specific sensor, electrode, tool, material to be delivered, or replacement tube) relative to the environment of the sample, e.g., within a cell. Notably, the securing means (70) include a connection point (76) for external microfluidic tubing, external cabling, external fiber optics, or any other external electronics or fluid housings (depicted by (77) in FIGS. 11C-11E) that are to be connected to the small form factor objects (42, 44). The external electronics of fluid housings are used to integrate larger fluid delivery systems or larger electronics not integrated into the body of the sample holder so as to access the sample in the specimen tip. It should be appreciated by the person skilled in the art that the embodiments shown in FIGS. 10a and 10b are illustrative and are not intended to limit the apparatus in any way.

Figure 12:
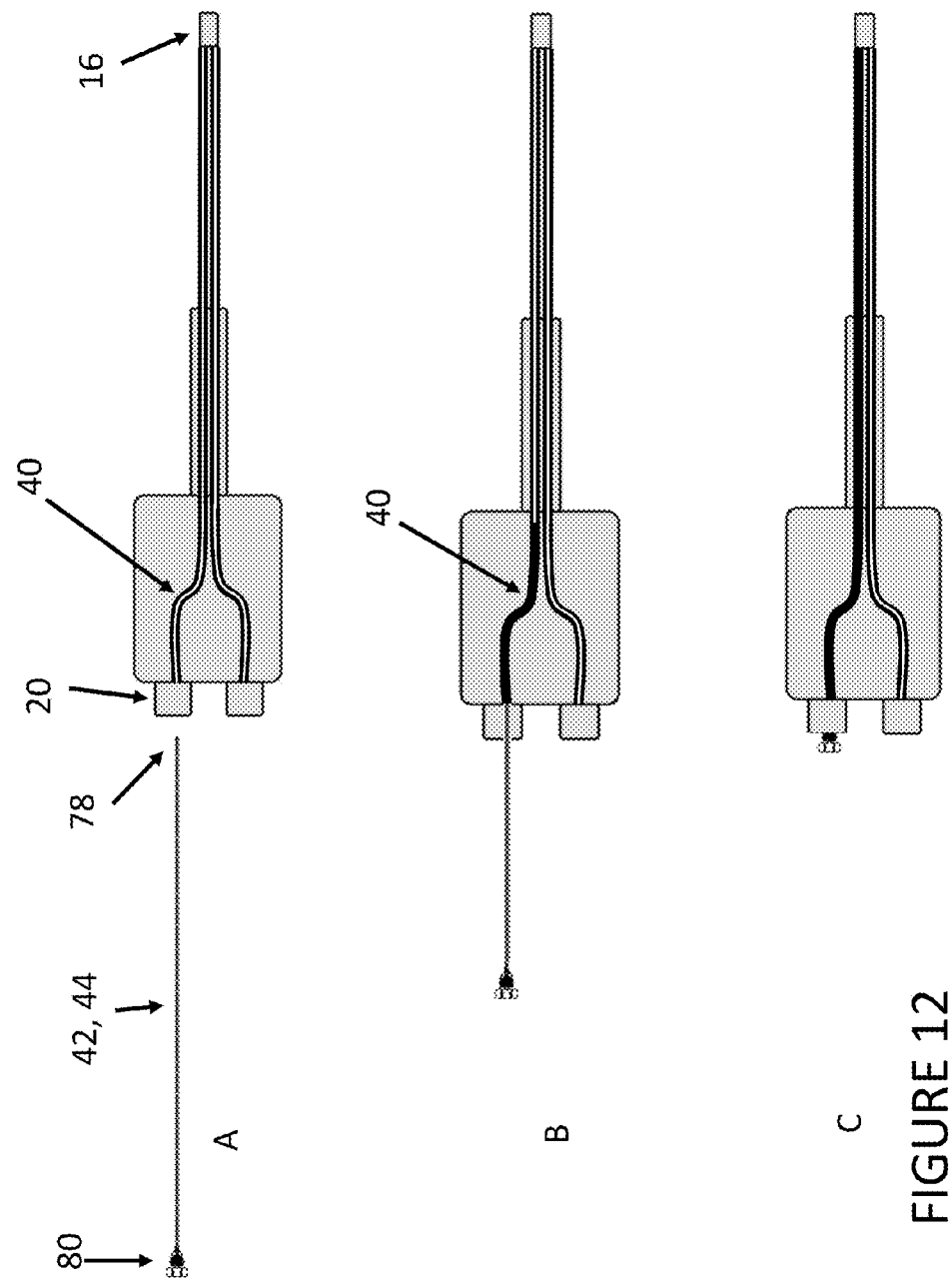
FIG. 12A illustrates the insertion of the preset length small form factor object (42, 44) into the at least one capillary (40) of the closed cell sample holder, wherein the at least one capillary (40) is empty.
FIG. 12B illustrates the insertion of the preset length small form factor object (42, 44) into the at least one capillary (40) of the closed cell sample holder during insertion.
FIG. 12C illustrates the preset length small form factor object (42, 44) within the at least one capillary (40) of the closed cell sample holder.

FIG. 12 illustrates the insertion of the preset length small form factor object (42, 44) into the at least one capillary (40) of the closed cell sample holder. In FIG. 12A, the at least one capillary (40) is empty. In FIG. 12B, the insertion of the small form factor object into the capillary (40) can be seen. Finally in FIG. 12C, the entire preset length small form factor object has been inserted and secured within the capillary (40). Although not shown in FIGS. 12A-12C, following insertion, the first end of the preset length small form factor object has emerged from the capillary (40) in proximity of the sample in the specimen tip (16) of the closed cell sample holder, to be discussed hereinbelow.

Figure 13:
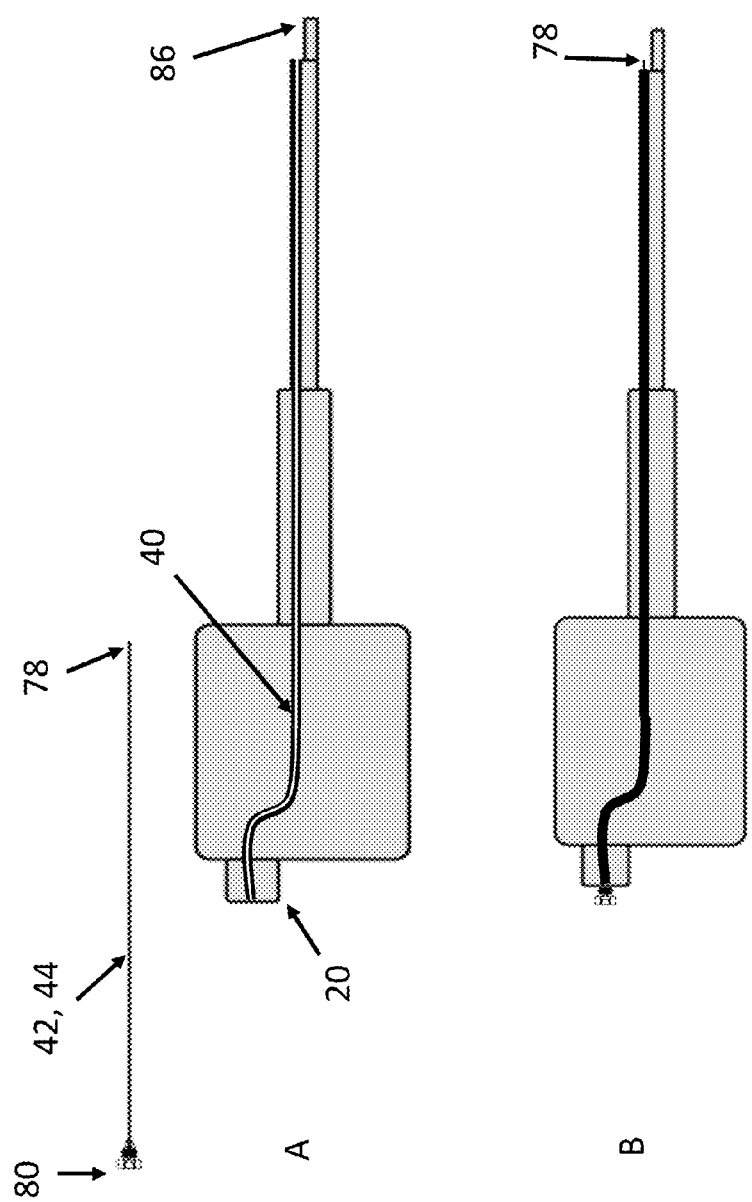
FIG. 13A illustrates the insertion of the preset length small form factor object (42, 44) into the at least one capillary (40) of the open cell sample holder, wherein the at least one capillary (40) is empty.
FIG. 13B illustrates the preset length small form factor object (42, 44) within the at least one capillary (40) of the open cell sample holder.

It is noted that the capillary and the preset length small form factor object (42, 44) is envisioned for use in an open cell sample holder (open to the environment of the electron microscope). In FIG. 13A, the at least one capillary (40) is empty. In FIG. 13B, the entire preset length small form factor object has been inserted and secured within the capillary (40). As shown in FIG. 13B, the first end (78) of the present length small form factor object has emerged from the capillary (40) in proximity of the sample in the specimen tip (86) of the open cell sample holder. Notably, sealing means, e.g., as shown in FIGS. 7-9, on the small form factor object are preferred in the open cell sample holder because of the vacuum environment.

Figure 14:
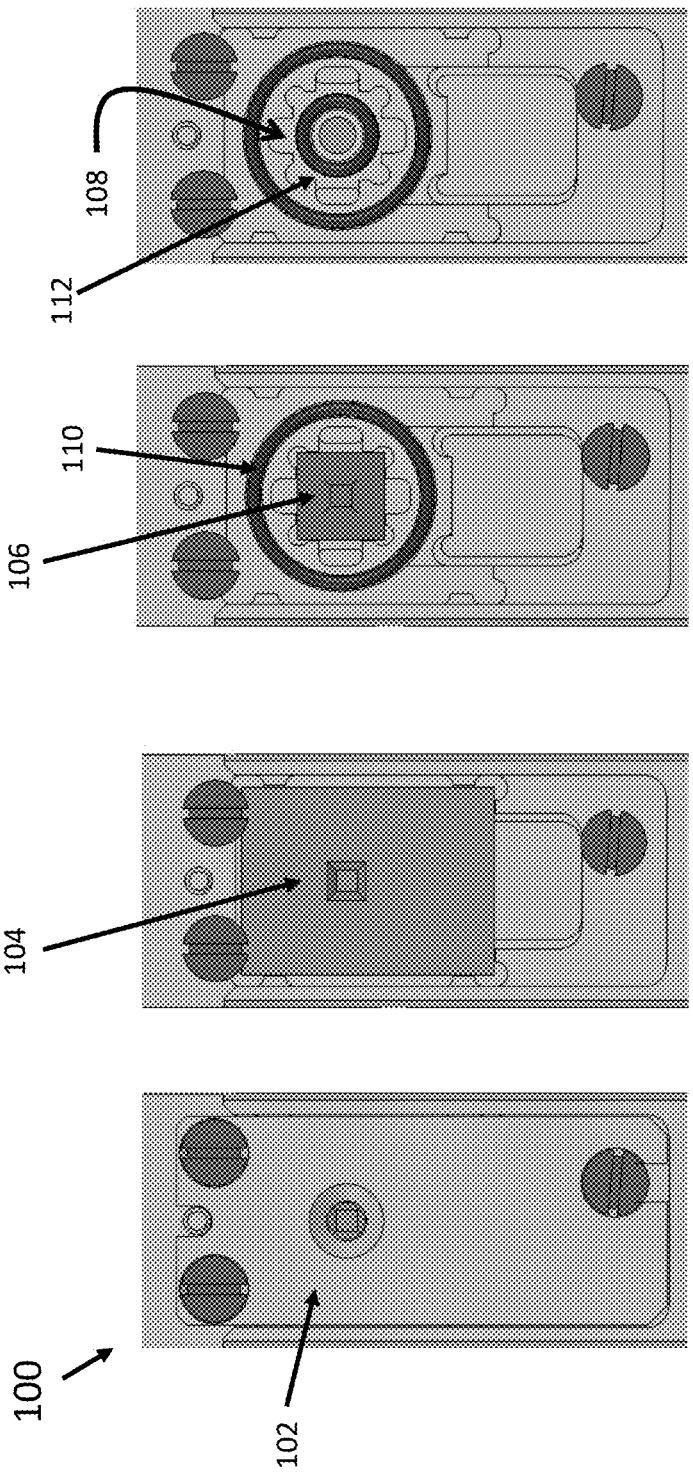
FIG. 14A is a plan view of the closed cell (100), wherein a cover (102) of the closed cell is shown positioned and affixed, e.g., with screws, to the cell.
FIG. 14B is a plan view of the closed cell with the cover off, revealing the first (104) of two MEMS chips positioned in the cell.
FIG. 14C is a plan view of the closed cell showing the second (106) of two MEMS chips after the first MEMS chip (104) is removed.
FIG. 14D is a plan view of the closed cell showing the bottom of the cell after the second MEMS chip (106) is removed.

FIGS. 14A-14D illustrate a prior art example of the closed cell that is positioned at the specimen tip. The closed cell in FIGS. 14A-14D is just for general illustration and is not intended to limit the closed cell in any way. FIG. 14A is a plan view of the closed cell (100), wherein a cover (102) of the closed cell is shown positioned and affixed, e.g., with screws, to the cell. FIG. 14B is a plan view of the closed cell with the cover off, revealing the first (104) of two MEMS chips (i.e., a sample support device) positioned in the cell. FIG. 14C is a plan view of the closed cell showing the second (106) of two MEMS chips after the first MEMS chip (104) is removed. The large (104) and small (106) MEMS chips are stacked on top of one another and the sample "sandwiched" between the two chips (not shown). FIG. 14C also reveals the first (110) of two O-rings, which is positioned below the large (104) MEMS chip to seal the cell so liquid or gas can be introduced into the cell. FIG. 14D is a plan view of the closed cell showing the bottom of the cell after the second MEMS chip (106) is removed. FIG. 14D also reveals the second (112) of two O-rings, which is positioned below the small MEMS chip (106) to form the second seal so liquid or gas can be introduced into the cell. The "fluidic reservoir" in FIG. 14D corresponds to the area between the two O-rings (110, 112) when the MEMS chips (104, 106) are in place. Although not illustrated in FIGS. 14A-14D per se, the fluidic reservoir indicated in FIG. 14D has depth to accommodate the MEMS chips (104, 106).

Figure 15:
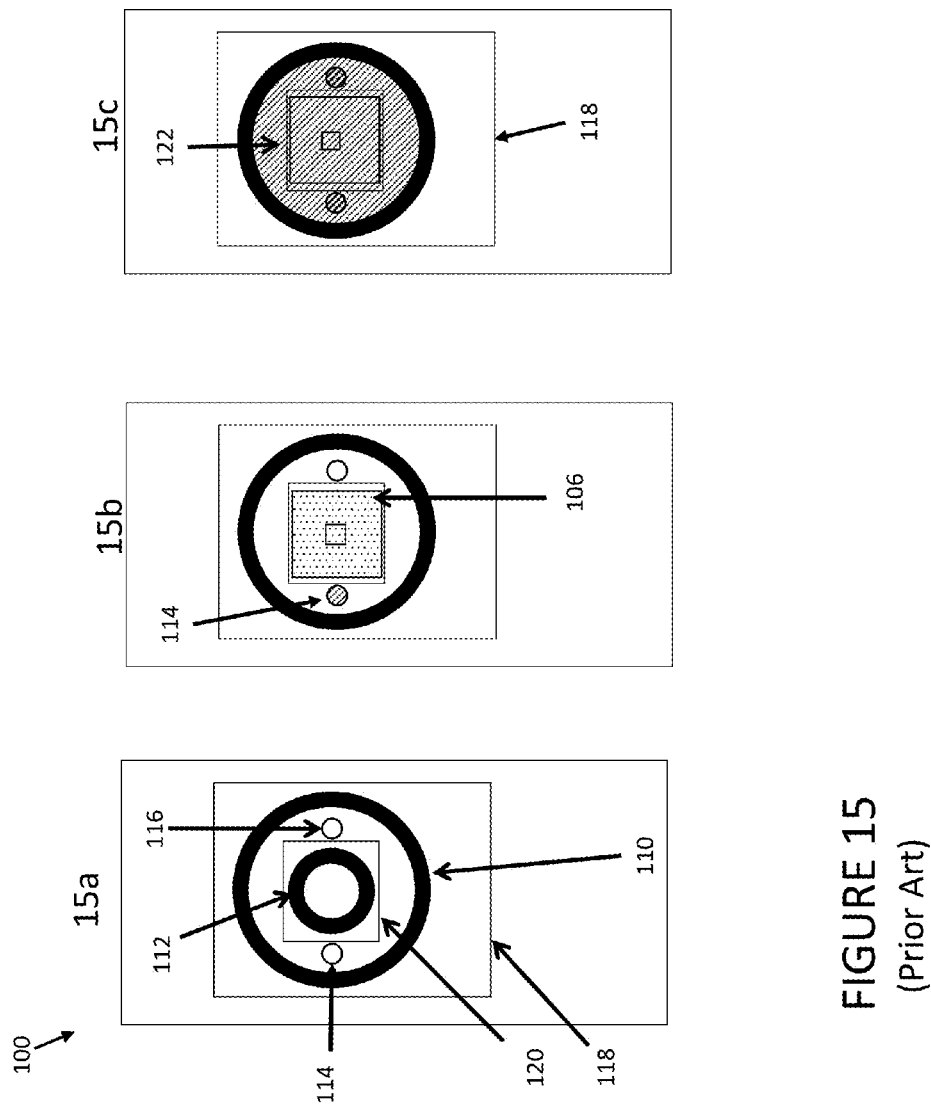
FIG. 15a is a plan view of the fluidic reservoir within the two-port closed cell showing the large (110) and small (112) O-rings, the two ports (114, 116), and the large (118) and small (120) MEMS chip pockets.
FIG. 15b is a plan view of the closed cell with small MEMS chip (106, dotted) positioned in the cell over the small O-ring with the fluid beginning to flow into the cell from port 1 (114, shown hatched).
FIG. 15c is a plan view of the closed cell where the fluid (122) has filled the reservoir and exits the reservoir via port 2 (116).

FIGS. 15a-15c illustrates the fluidic reservoir within a two port closed cell that is positioned at the specimen tip (for example, (16) in FIGS. 1 and 2). The closed cell (100) in FIGS. 15a-15c, which does not illustrate the cover nor the large MEMS chip, is just for general illustration and is not intended to limit the closed cell in any way. FIG. 15a is a plan view of the fluidic reservoir within the two-port closed cell showing the large (110) and small (112) O-rings, the two ports (114, 116), and the large (118) and small (120) MEMS chip pockets. It should be appreciated that the chip pockets (118, 120) can include the protrusions shown in FIGS. 14A-14D, which are not shown in FIGS. 15a-15c. FIG. 15b is a plan view of the closed cell with small MEMS chip (106, dotted) positioned in the cell over the small O-ring with the fluid, e.g., liquid or gas, beginning to flow into the cell from port 1 (114, shown hatched). FIG. 15c is a plan view of the closed cell where the fluid (122) has filled the reservoir and exits the reservoir via port 2 (116). Although not shown, in order to fill the reservoir as depicted in FIG. 15c, the large MEMS chip has to be in place in the larger pocket (118) covering the large O-ring (110). The large MEMS chip is not shown so that the filled reservoir can be easily envisioned by the person skilled in the art.

Figure 16:
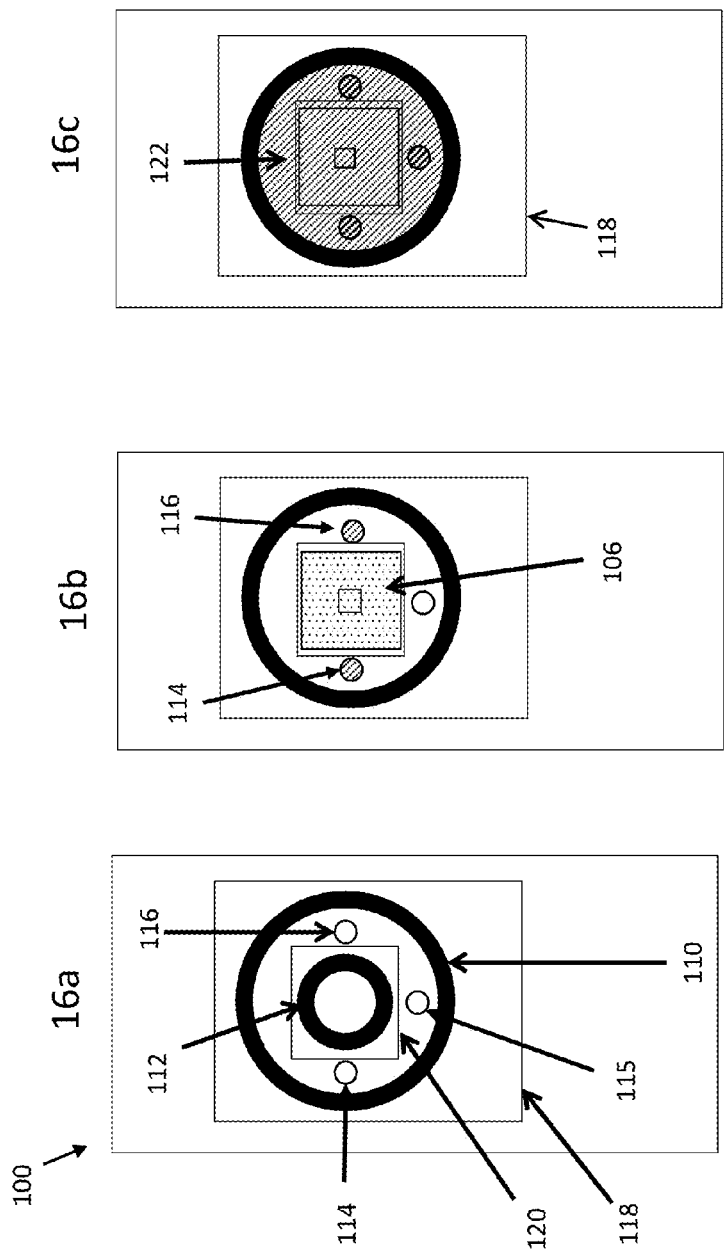
FIG. 16a is a plan view of the fluidic reservoir within the three-port closed cell showing the large (110) and small (112) O-rings, the three ports (114, 115, 116), and the large (118) and small (120) MEMS chip pockets.
FIG. 16b is a plan view of the closed cell with small MEMS chip (106, dotted) positioned in the cell over the small O-ring with the fluid beginning to flow into the cell from ports 1 (114) and 2 (116).
FIG. 16c is a plan view of the closed cell where the fluid (122) has filled the reservoir and exits the reservoir via port 3 (115).

FIGS. 16a-16c illustrates the fluidic reservoir within a three port closed cell that is positioned at the specimen tip (for example, (16) in FIGS. 1 and 2). The closed cell (100) in FIGS. 16a-16c, which does not illustrate the cover nor the large MEMS chip, is just for general illustration and is not intended to limit the closed cell in any way. FIG. 16a is a plan view of the fluidic reservoir within the three-port closed cell showing the large (110) and small (112) O-rings, the three ports (114, 115, 116), and the large (118) and small (120) MEMS chip pockets. It should be appreciated that the chip pockets (118, 120) can include the protrusions shown in FIGS. 14A-14D, which are not shown in FIGS. 16a-16c. FIG. 16b is a plan view of the closed cell with small MEMS chip (106, dotted) positioned in the cell over the small O-ring with the fluid, e.g., liquid or gas, beginning to flow into the cell from ports 1 (114) and 2 (116). FIG. 16c is a plan view of the closed cell where the fluid (122) has filled the reservoir and exits the reservoir via port 3 (115). Although not shown, in order to fill the reservoir as depicted in FIG. 16c, the large MEMS chip has to be in place in the larger pocket (118) covering the large O-ring (11). The large MEMS chip is not shown so that the filled reservoir can be easily envisioned by the person skilled in the art.

Figure 17:
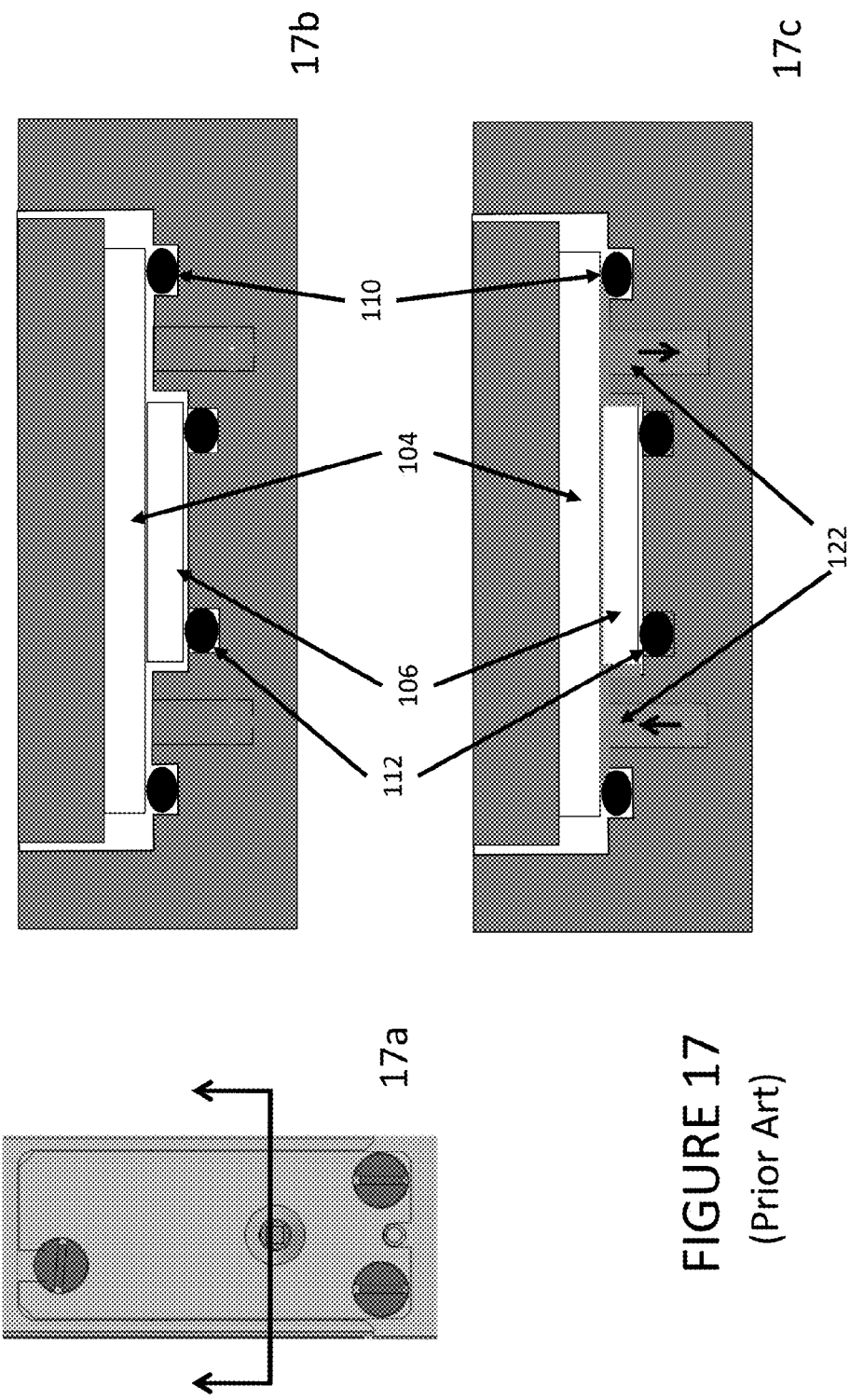
FIG. 17a is a plan view of a two port closed cell.
FIG. 17b is the cross-section of the cell of FIG. 17a, wherein the cell does not have any fluid introduced thereto.
FIG. 17c is the cross-section of the cell of FIG. 17a, wherein the cell has fluid flowing thereto.

FIG. 17 illustrates the cross section of a two port cell, e.g., FIGS. 15a-15c. For example, FIGS. 17b and 17c illustrate the cross-section of the cell of FIG. 17a, where FIG. 17a is a plan view of a two port closed cell. FIG. 17b corresponds to the cell without fluid while FIG. 17c is the cell with fluid (122) flowing through it. The purpose of FIG. 17 is to illustrate the gaps where there is less resistance to flow around the MEMS chips (104, 106) than the small gaps between the MEMS chips. The liquid flow will be higher in gaps of larger cross sectional area than those with small cross sectional area. Although not shown, the sample is positioned in the small gap between the MEMS chips (104, 106). Further, FIG. 17 illustrates the "fluidic reservoir" corresponding to the area between the two O-rings (110, 112) when the MEMS chips (104, 106) are in place.

Figure 18:
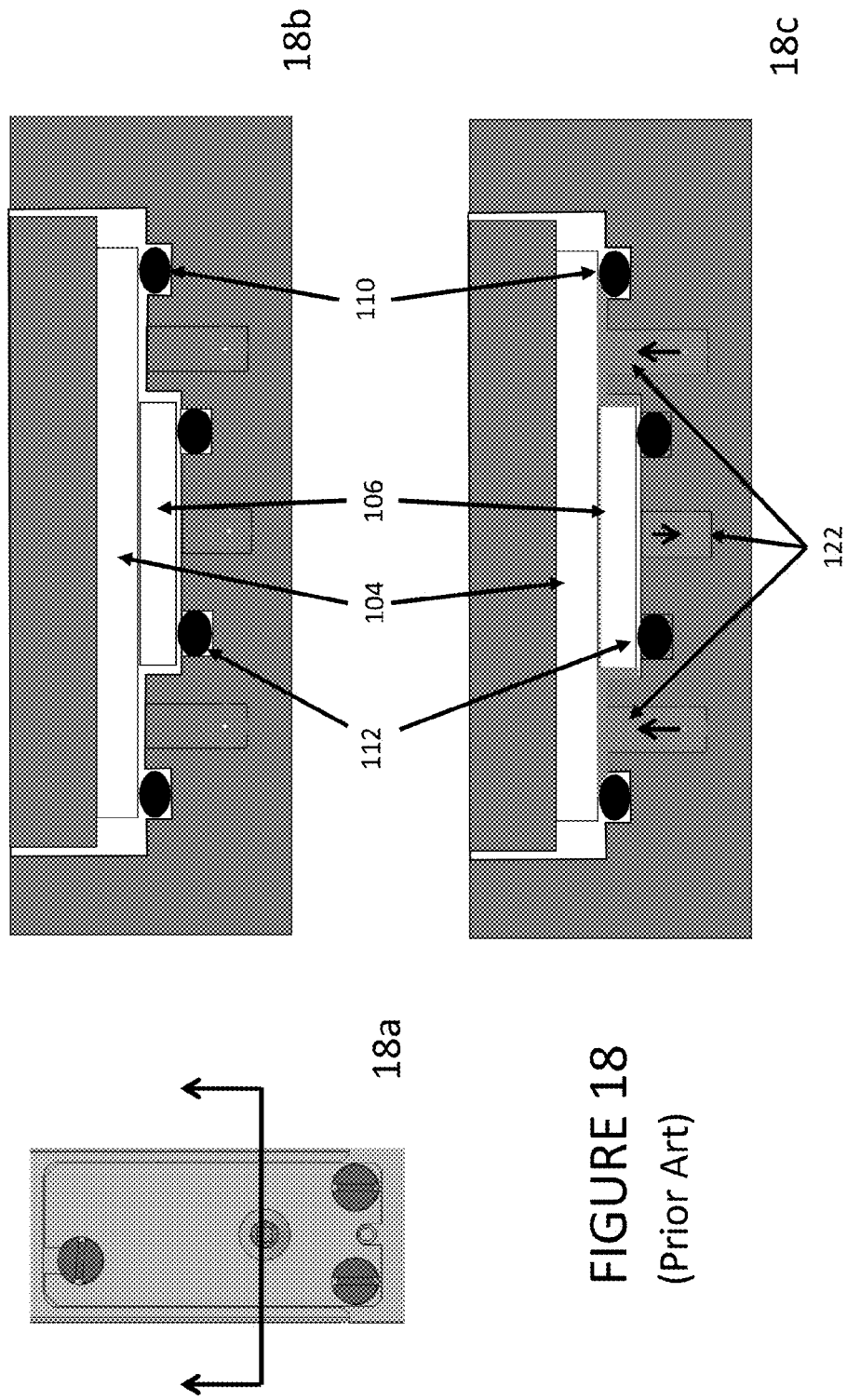
FIG. 18a is a plan view of a three port closed cell.
FIG. 18b is the cross-section of the cell of FIG. 18a, wherein the cell does not have any fluid introduced thereto.
FIG. 18c is the cross-section of the cell of FIG. 18a, wherein the cell has fluid flowing thereto.

FIG. 18 illustrates the cross section of a three port cell, e.g., FIGS. 16a-16c. For example, FIGS. 18b and 18c illustrate the cross-section of the cell of FIG. 18a, where FIG. 18a is a plan view of a three port cell. FIG. 18b corresponds to the cell without fluid while FIG. 18c is the cell with fluid (122) flowing through it. The purpose of FIG. 18 is to illustrate the gaps where there is less resistance to flow around the MEMS chips (104, 106) than the small gaps between the MEMS chips. The liquid flow will be higher in gaps of larger cross sectional area than those with small cross sectional area. Although not shown, the sample is positioned in the small gap between the MEMS chips (104, 106). Further, FIG. 18 illustrates the "fluidic reservoir" corresponding to the area between the two O-rings (110, 112) when the MEMS chips (104, 106) are in place.

FIG. 19 illustrates how the at least one capillary (40) and the removable tubing (42) or small form factor object (44) may be arranged in the sample area of the holder. FIG. 19a shows the specimen tip (16) of the sample holder where the at least one capillary is terminated and a fluidic pathway (130) extends to the fluidic reservoir (122). Although shown as terminating before the fluidic reservoir (122) because of geometric limitations, it should be appreciated that the at least one capillary (40) may terminate closer to or within the fluidic reservoir (122). Accordingly, "an area in substantial proximity to the specimen tip" can correspond to the termination of the at least one capillary where the main shaft (i.e., barrel, 132) of the holder meets the specimen tip (16) or at any location within the specimen tip (16), including the actual fluidic reservoir (122). FIG. 19a does not show the removable tubing (42) or small form factor object (44). FIG. 19b illustrates the same design as FIG. 19a with the removable tubing (42) or small form factor object (44) inserted. It should be appreciated that FIGS. 19a-19b correspond to the two port closed cell, but a three port closed cell has the same basic design with an extra port.

As indicated, the specimen tip of the sample holder comprises a fluidic reservoir (122) and the at least one capillary (40) that (i) terminates in the specimen tip (16) between the barrel (132) and the fluidic reservoir (122), (ii) terminates in the fluidic reservoir (122), or (iii) terminates at the interface of the specimen tip (16) and the barrel (132).

FIGS. 20a and 20b illustrate an embodiment of a method to seal the at least one capillary (40) to the specimen tip (16) of the holder. FIG. 20a shows an elastomer seal around the capillaries. This could either be an elastomer seal between the specimen tip (16) and the capillaries (not shown), or it could be an elastomer seal between the specimen tip (16) and the main shaft (132), or a combination of both. Typical elastomeric materials include, but are not limited to, perfluoroelastomers, fluoroelastomers, and EPDM. FIG. 20b shows a method of permanently affixing the at least one capillary (40) to the specimen tip (16) of the holder by such methods as a welding, brazing or adhering with an adhesive such as epoxy. It should be appreciated that FIGS. 20a-20b correspond to the two port closed cell, but a three port closed cell has the same basic design with an extra port.

It should be appreciated that while removable tubing is depicted in many of the figures, removable tubing may be substituted by other small form factor objects such as sensors, tools, and the like.

In one aspect, an electron microscope sample holder comprising an end, a barrel, a specimen tip, and at least one capillary that travels from the end of the sample holder along the barrel to the specimen tip is described, wherein the at least one capillary has an inner diameter that accommodates a small form factor object selected from the group consisting of removable tubing, sensors, tools, electrodes, and combinations thereof.

In another aspect, a method of imaging a sample in an electron microscope is described, said method comprising positioning a sample in a specimen tip of an electron microscope sample holder, inserting the sample holder comprising the sample in an electron microscope, and imaging the sample in the electron microscope, wherein the electron microscope sample holder comprises an end, a barrel, a specimen tip, and at least one capillary that travels from the end of the sample holder along the barrel to the specimen tip, wherein the at least one capillary has an inner diameter that accommodates a small form factor object selected from the group consisting of removable tubing, sensors, tools, electrodes, and combinations thereof. In one embodiment, the sample holder comprises the small form factor object. The sample holder can be an open cell or a closed cell. When the sample holder is a closed cell holder, as described herein, the method further comprises introducing a liquid and/or gas to the sample.

In still another aspect, a method of preparing an electron microscope sample holder for imaging is described, said method comprising inserting a small form factor object into a capillary such that a first end of the small form factor object is in close proximity to a sample in a specimen tip of the sample holder, wherein the electron microscope sample holder comprises an end, a barrel, the specimen tip, and at least one capillary that travels from the end of the sample holder along the barrel to the specimen tip, wherein the at least one capillary has an inner diameter that accommodates the small form factor object selected from the group consisting of removable tubing, sensors, tools, electrodes, and combinations thereof The method can further comprise positioning a sample in a specimen tip of an electron microscope sample holder, inserting the sample holder comprising the sample in an electron microscope, and imaging the sample in the electron microscope.

In still another aspect, the small form factor object has a preset length and a first end and a second end, wherein the small form factor object is selected from the group consisting of removable tubing, sensors, tools, electrodes, and combinations thereof, wherein the first end comprises a sensor, electrode, tool, material to be delivered, or an open end of a removable tube, and wherein the second end comprises securing means for securing the small form factor object in an electron microscope sample holder. In one embodiment, the securing means comprise a threaded male member that can be inserted into a complimentary female fitting at the end of the sample holder. The small form factor object can further comprise a sealing means positioned at some location along the length of the small form factor object.

Importantly, the small form factor objects of preset length can be bundled in kits that the user can purchase from a manufacturer based on the make and model of electron microscope sample holder. For example, the replacement tubes can be bundled in sets of 1, 2, 3, 4, 5, 6, 7, 8, 9, or 10 or more replacement tubes, each have the same as or different chemical compatibilities. The kits would can comprise at least one small form factor object as well as supporting electronics, cabling and ground equipment. Examples of bundled kits include, but are not limited to: (i) fluid flow kits including one or more of removable tube inserts, static insert plugs, restraining hardware, interconnect microfluidic tubing, fluid delivery system, and/or microfluidic unions; (ii) sensor kits including one or more of removable sensor insert, restraining hardware, interconnect cabling or fiber optics, and/or signal or power connectors measurement hardware; (iii) stimuli kits including one or more of removable electrode or stimuli insert, restraining hardware, interconnect cabling or fiber optics, signal or power connectors, and/or sourcing hardware; and (iv) tool kits including one or more of removable tool insert and/or user accessible controller. It should be appreciated that the kits may further comprise at least one capillary for sample holders where the at least one capillary is accessible by the user.

While the invention has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. An electron microscope sample holder comprising:
   an end;
   a barrel;
   a specimen tip;
   a fixed first tube that extends from the end of the sample holder along the barrel to the specimen tip; and
   a removable small form factor object comprising:
      a second tube having a first end portion removably insertable into an interior of the fixed first tube; and
      a sealing structure mounted on an exterior of the second tube,
   wherein, when the first end portion of the second tube is inserted into the interior of the fixed first tube, the sealing structure forms a temporary fluid seal between the exterior of the first end portion of the second tube and the interior of the fixed first tube.

2. The sample holder of claim 1, wherein the specimen tip comprises a fluidic reservoir and the fixed first tube terminates (a) in the specimen tip between the barrel and the fluidic reservoir, (b) at an interface of the specimen tip and the barrel, or (c) in the fluidic reservoir.

3. The sample holder of claim 1, further comprising a fixed third tube that extends from the end of the sample holder along the barrel to the specimen tip.

4. The sample holder of claim 3, wherein the fixed third tube accommodates the same or different small form factor object therein.

5. The sample holder of claim 1, wherein the second tube has an outer diameter that is less than the inner diameter of the fixed first tube such that the second tube can be inserted into and removed from the fixed first tube.

6. The sample holder of claim 1, wherein, when the first end portion of the second tube is inserted into the interior of the fixed first tube, the first end portion of the second tube is positioned in proximity of a sample in the specimen tip.

7. The sample holder of claim 1, wherein the temporary fluid seal is selected from the group consisting of elastomeric compression, swaged compression, ferrule compression, barbed seal, and any combination thereof.

8. The sample holder of claim 1, wherein the small form factor object comprises a sensor, electrode, tool, or material to be delivered.

9. The sample holder of claim 1, wherein the first end portion of the second tube comprises an open tube.

10. The sample holder of claim 1, wherein a second end portion of the second tube opposite the first end portion has a securing member for securing the small form factor object in the sample holder.

11. The sample holder of claim 10, wherein the securing member comprises a threaded member that can be inserted into a complimentary threaded fitting at the end of the sample holder.

12. The sample holder of claim 11, wherein the second end portion of the second tube further comprises a connection point for connecting external microfluidic tubing, external cabling, external fiber optics, or any other external connections to the small form factor object.

13. The sample holder of claim 1, wherein the specimen tip comprises a closed cell comprising a closed cell body, a closed cell cover, and at least one seal.

14. The sample holder of claim 13, further comprising at least one MEMS chip in the closed cell.

15. A method of imaging a sample in an electron microscope, said method comprising positioning a sample in a specimen tip of an electron microscope sample holder, inserting the sample holder comprising the sample in an electron microscope, and imaging the sample in the electron microscope, wherein the electron microscope sample holder comprises an end, a barrel, the specimen tip, and a fixed first tube that extends from the end of the sample holder along the barrel to the specimen tip, and a removable small form factor object comprising:
   a second tube having a first end portion removably insertable into an interior of the fixed first tube; and
   a sealing structure mounted on an exterior of the second tube,
   wherein, when the first end portion of the second tube is inserted into the interior of the fixed first tube, the sealing structure forms a temporary fluid seal between the exterior of the first end portion of the second tube and the interior of the fixed first tube.

16. A method of preparing an electron microscope sample holder for imaging, said method comprising inserting a removable small form factor object into a fixed first tube such that a first end of the small form factor object is in close proximity to a sample in a specimen tip of the sample holder, wherein the electron microscope sample holder comprises an end, a barrel, and the specimen tip, and wherein:
   the fixed first tube extends from the end of the sample holder along the barrel to the specimen tip; and
   the removable small form factor object comprises:
      a second tube having a first end portion removably insertable into an interior of the fixed first tube; and
      a sealing structure mounted on an exterior of the second tube,
   wherein, inserting the removable small form factor object into the fixed first tube comprises inserting the first end portion of the second tube into the interior of the fixed first tube, and the sealing structure forming a temporary fluid seal between the exterior of the first end portion of the second tube and the interior of the fixed first tube.

17. The sample holder of claim 1, wherein the sealing structure comprises an elastomeric ring.

18. The sample holder of claim 17, wherein the first end portion of the second tube comprises an exterior recess that engages the elastomeric ring.

19. The sample holder of claim 1, wherein the sealing structure comprises at least one barb.

20. The sample holder of claim 1, wherein the first end portion of the second tube comprises a tapered terminus.

* * * * *